United States Patent
Shim et al.

(10) Patent No.: US 7,084,788 B2
(45) Date of Patent: Aug. 1, 2006

(54) CODE GENERATION AND ALLOCATION METHOD

(75) Inventors: Jae-seong Shim, Seoul (KR); Ki-hyun Kim, Daejeon (KR); Hyun-soo Park, Seoul (KR); Kiu-hae Jung, Seoul (KR); Iqbal Mahboob, Gujranwals (PK)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/028,549

(22) Filed: Jan. 5, 2005

(65) Prior Publication Data

US 2005/0116844 A1   Jun. 2, 2005

Related U.S. Application Data

(63) Continuation of application No. 10/787,156, filed on Feb. 27, 2004, now Pat. No. 6,859,152, which is a continuation of application No. 10/125,564, filed on Apr. 19, 2002, now Pat. No. 6,781,527.

(30) Foreign Application Priority Data

Apr. 20, 2001 (KR) ............................... 2001-21360

(51) Int. Cl.
  *H03M 5/00* (2006.01)

(52) U.S. Cl. .............................. 341/58; 341/59; 341/67

(58) Field of Classification Search ............ 341/58–59, 341/67
See application file for complete search history.

(56) References Cited

U.S. PATENT DOCUMENTS 5,144,304 A   9/1992  McMahon et al.

(Continued)

FOREIGN PATENT DOCUMENTS

EP   1 047 197 A2   10/2000

OTHER PUBLICATIONS

U.S. Appl. No. 10/787,156, filed Feb. 2004, Jae-Seong Shim, et al., Samsung Electronics Co., Ltd.

(Continued)

*Primary Examiner*—Eguy JeanPierre
*Assistant Examiner*—Khai Nugen
(74) *Attorney, Agent, or Firm*—Stein, McEwen & Bui, LLP

(57) ABSTRACT

A method of generating and allocating codewords includes allocating one of two selectable codewords b1 and b2 as codeword "b" when a preceding codeword "a" and a following codeword "b" form a code stream X, in which the codewords b1 and b2 have opposite INV values which are parameters indicating whether the number of '1s' contained in a codeword is an odd number or an even number. When the code stream of the preceding codeword "a" and the following codeword b1 is X1, and when the code stream of the preceding codeword "a" and the following codeword b2 is X2, the codewords are allocated such that the INV values of X1 and X2 are maintained to be opposite when the preceding codeword "a" or the following codeword b1(b2) (b1 or b2) should be replaced by another codeword in compliance with a predetermined boundary condition given between codewords. The codewords are allocated so that a DC suppression capability of the code stream can be maintained.

11 Claims, 25 Drawing Sheets

| CODEWORD a | CODEWORD b | CHANGE IN INV |
|---|---|---|
| xxxxxxxxx001001 (BEFORE CONVERSION) → xxxxxxxxx001000 (AFTER CONVERSION) | 0100xxxxxxxxxx | CHANGE |
| xxxxxxxxx010001 (BEFORE CONVERSION) → xxxxxxxxx010000 (AFTER CONVERSION) | | |
| xxxxxxxxx100001 (BEFORE CONVERSION) → xxxxxxxxx100100 (AFTER CONVERSION) | | |
| ~ | | NO |
| xxx100000000001 (BEFORE CONVERSION) → xxx100000000100 (AFTER CONVERSION) | | |

DC CONTROL CODEWORD

U.S. PATENT DOCUMENTS

| | | |
|---|---|---|
| 5,739,779 A | 4/1998 | Kunisa et al. |
| 5,818,362 A | 10/1998 | Walker |
| 5,847,666 A | 12/1998 | Yasoshima et al. |
| 5,852,520 A | 12/1998 | Ido et al. |
| 6,011,497 A | 1/2000 | Tsang et al. |
| 6,084,535 A | 7/2000 | Karabed et al. |
| 6,229,458 B1 | 5/2001 | Altekar et al. |
| 6,268,810 B1 * | 7/2001 | Shim et al. .................. 341/59 |
| 6,281,815 B1 | 8/2001 | Shim et al. |
| 6,285,302 B1 | 9/2001 | McClellan |
| 6,441,756 B1 | 8/2002 | Shim |
| 6,859,152 B1 * | 2/2005 | Shim et al. .................. 341/58 |

OTHER PUBLICATIONS

Coene, "Combi-Codes For DC-Free Runlength-Limited Coding", *IEEE Transactions On Consumer Electronics*, vol. 46, No. 4, Nov. 2000.

Kim et al., "(4, 20) runlength limited modulation code for high density storage system", *Electronics Letters*, vol. 31, No. 7, Mar. 1995.

* cited by examiner

FIG. 2  (PRIOR ART)

| NCG | 1 | | 2 | | 3 | | 4 | |
|---|---|---|---|---|---|---|---|---|
| CODE GROUP CONTAINING CODEWORD INDICATED BY NCG | CONVERSION CODE GROUP | DC SUPPRESSION CODE GROUP FOR DC SUPPRESSION CONTROL WITH THE HELP OF MCG1 | CONVERSION CODE GROUP | DC SUPPRESSION CODE GROUP FOR DC SUPPRESSION CONTROL WITH THE HELP OF MCG2 | CONVERSION CODE GROUP | DC SUPPRESSION CODE GROUP FOR DC SUPPRESSION CONTROL WITH THE HELP OF DCG1 | CONVERSION CODE GROUP | DC SUPPRESSION CODE GROUP FOR DC SUPPRESSION CONTROL WITH THE HELP OF DCG2 |
| | MCG1 | 1st DSV CODE GROUP | MCG2 | 2nd DSV CODE GROUP | DCG1 | 3rd DSV CODE GROUP | DCG2 | 4th DSV CODE GROUP |
| CHARACTERISTIC | LZ=2~9 | LZ=2~9 | LZ=0~1 | LZ=0~1 | b15 (MSB)=b3=0 | b3=0 | b15 (MSB)=1 or b3=1 | |
| METHOD FOR DUPLICATED CODE | CODEWROD OF EZ=2~5 REPEATEDLY OCCURS IN ALL KINDS OF CODE GROUPS | | | | | | | |

FIG. 4

| | LZ (EZ) | NUMBER | ADD | NUMBER | DELETE | NUMBER | TOTAL NUMBER (DUPLICATED) |
|---|---|---|---|---|---|---|---|
| MCG1 | $2 \leq LZ \leq 10$ ($0 \leq EZ \leq 8$) | 177 | $LZ=1$ ($0 \leq EZ \leq 8$) | 83 | | | 260(4) |
| MCG2 | $1 \leq LZ \leq 9$ ($0 \leq EZ \leq 8$) | 257 | | | | | 257(1) |
| MCG3 | $0 \leq LZ \leq 6$ ($0 \leq EZ \leq 8$) | 360 | | | $LZ=1$ ($0 \leq EZ \leq 8$) | 83 | 277(21) |
| MCG4 | $0 \leq LZ \leq 2$ ($0 \leq EZ \leq 8$) | 262 | | | | | 262(6) |

FIG. 5

| | LZ (EZ) | NUMBER | ADD | NUMBER | DELETE | NUMBER | TOTAL NUMBER |
|---|---|---|---|---|---|---|---|
| DCG1 | $2 \leq LZ \leq 10$ ($0 \leq EZ \leq 8$) | 375 | $LZ=1$ ($0 \leq EZ \leq 8$) | 177 | | | 552 |
| DCG2 | $1 \leq LZ \leq 9$ ($0 \leq EZ \leq 8$) | 546 | | | | | 546 |
| DCG3 | $0 \leq LZ \leq 6$ ($0 \leq EZ \leq 8$) | 763 | | | $LZ=1$ ($0 \leq EZ \leq 8$) | 177 | 586 |
| DCG4 | $0 \leq LZ \leq 2$ ($0 \leq EZ \leq 8$) | 556 | | | | | 556 |

| | LZ (EZ) | NUMBER | ADD | NUMBER | | NUMBER | TOTAL NUMBER |
|---|---|---|---|---|---|---|---|
| ACG1 | LZ≠0 (9≤EZ≤10) | 5 | SURPLUS CODE OF MCG1 | 4 | | | 9 |
| ACG2 | LZ≠0 (9≤EZ≤10) | 5 | SURPLUS CODE OF MCG2 | 1 | | | 6 |
| ACG3 | LZ≠1 (9≤EZ≤10) | 5 | SURPLUS CODE OF MCG3 | 21 | 7≤LZ≤8 (0≤EZ≤8) | 15 | 41 |
| ACG4 | (9≤EZ≤10) | 7 | SURPLUS CODE OF MCG4 | 6 | 3≤LZ≤5 (0≤EZ≤8) | 85 | 98 |

CODEWORD a   CODEWORD b

| CODEWORD a | CODEWORD b | CHANGE IN INV |
|---|---|---|
| xxxxxxxx001001 (BEFORE CONVERSION) → xxxxxxxx001000 (AFTER CONVERSION) | 0100xxxxxxxxxx | CHANGE |
| xxxxxxxx010001 (BEFORE CONVERSION) → xxxxxxxx010000 (AFTER CONVERSION) | | |
| xxxxxxxx100001 (BEFORE CONVERSION) → xxxxxxxx100100 (AFTER CONVERSION) | | NO |
| ~ | | |
| xxx100000000001 (BEFORE CONVERSION) → xxx100000000100 (AFTER CONVERSION) | | |

DC CONTROL CODEWORD

FIG. 11A

| DATA SYMBOL | MCG1 Code Word MSB  LSB | NCG | MCG2 Code Word MSB  LSB | NCG | MCG3 Code Word MSB  LSB | NCG | MCG4 Code Word MSB  LSB | NCG |
|---|---|---|---|---|---|---|---|---|
| 000 | 000100100000000 | 4 | 000100100000000 | 4 | 100100000000001 | 1 | 100100000000001 | 1 |
| 001 | 000010010000000 | 4 | 000010010000000 | 4 | 001001000000001 | 1 | 010010000000001 | 1 |
| 002 | 001000100100000 | 4 | 000100100100000 | 4 | 000000100000001 | 1 | 001001000000001 | 1 |
| 003 | 010010010000000 | 4 | 000000100000000 | 4 | 100000000100001 | 1 | 100100100000001 | 1 |
| 004 | 010000100100000 | 4 | 000000010000000 | 4 | 100000001000001 | 1 | 100010010000001 | 1 |
| 005 | 010000001001001 | 1 | 000000000100010 | 2 | 100100000000010 | 2 | 100001001000001 | 1 |
| 006 | 010000010010000 | 3 | 000100000000001 | 1 | 001001000000010 | 2 | 100000100100001 | 1 |
| 007 | 010000010010001 | 1 | 010010010000001 | 1 | 001000000000010 | 2 | 100100010000001 | 1 |
| 008 | 010010000010010 | 2 | 010001001000001 | 1 | 100100000010010 | 2 | 100010001000001 | 1 |
| 009 | 010010010000001 | 1 | 010000100100001 | 1 | 001001000010010 | 2 | 100001000100001 | 1 |
| 010 | 000001001000000 | 4 | 000010000000001 | 1 | 000100100010010 | 2 | 010010010000001 | 1 |
| 011 | 000000100100000 | 4 | 010010010000001 | 1 | 100000000010010 | 2 | 010010010000001 | 1 |
| 012 | 000000010010000 | 3 | 010001000100001 | 1 | 100000000100010 | 2 | 010000100100001 | 1 |
| 013 | 000000001001000 | 3 | 001001001000001 | 1 | 100100000000100 | 3 | 100000000100001 | 1 |
| 014 | 000000000100100 | 3 | 001000100100001 | 1 | 001001000000100 | 3 | 100100000000010 | 2 |
| 015 | 000000000100010 | 2 | 000001000000001 | 1 | 000100100000100 | 3 | 010010000000010 | 2 |
| 016 | 000000000100001 | 1 | 010010000100001 | 1 | 000000100000100 | 3 | 001001000000010 | 2 |
| 017 | 000000000010010 | 3 | 001001000100001 | 1 | 100000010010000 | 3 | 100100100000010 | 2 |
| 018 | 010001001000001 | 1 | 000100100100001 | 1 | 100000001001000 | 3 | 100010010000010 | 2 |
| 019 | 010010001000000 | 4 | 000000100000001 | 1 | 100000000100100 | 3 | 100001001000010 | 2 |
| 020 | 010010000000010 | 2 | 010010000000001 | 1 | 100000100010000 | 3 | 100000100100010 | 2 |
| 021 | 010000100100001 | 1 | 001001000000001 | 1 | 100000010001000 | 3 | 100000100100010 | 2 |
| 022 | 010001001000100 | 4 | 000100100000001 | 1 | 100000001000100 | 3 | 100100010000010 | 2 |
| 023 | 010010000000001 | 1 | 000010010000001 | 1 | 100001000010000 | 3 | 100010001000010 | 2 |
| 024 | 000100000000001 | 1 | 000001001000001 | 1 | 100000100001000 | 3 | 100001000100010 | 2 |
| 025 | 001001001000000 | 4 | 000000100100001 | 1 | 100000000100000 | 4 | 100000100010010 | 2 |
| 026 | 000000000010001 | 1 | 010001000000001 | 1 | 000100100000000 | 4 | 010010010000010 | 2 |
| 027 | 010010010000000 | 4 | 001001000100001 | 1 | 000010010000000 | 4 | 010001001000010 | 2 |
| 028 | 000010000000001 | 1 | 000100010000001 | 1 | 000001001000000 | 4 | 100100000010010 | 2 |
| 029 | 010000001001000 | 3 | 000010001000001 | 1 | 000000100100000 | 4 | 010010000010010 | 2 |
| 030 | 010010001000001 | 1 | 000001000100001 | 1 | 100010010000000 | 4 | 100000000010010 | 2 |
| 031 | 010000000100100 | 3 | 010000100000001 | 1 | 100001001000000 | 4 | 100000000100010 | 2 |
| 032 | 010001000100001 | 1 | 001001000000001 | 1 | 100000100100000 | 4 | 010000000100010 | 2 |
| 033 | 010000100010010 | 3 | 000100001000001 | 1 | 100100010000000 | 4 | 100000001000010 | 2 |
| 034 | 010000000010010 | 2 | 000010000100001 | 1 | 100100000001001 | 1 | 010000000100010 | 2 |
| 035 | 010000000001001 | 1 | 010000010000001 | 1 | 001001000001001 | 1 | 100100000000100 | 3 |
| 036 | 001001000000001 | 1 | 001000001000001 | 1 | 000100100001001 | 1 | 100000000001000 | 3 |
| 037 | 001001001000000 | 4 | 000100000100001 | 1 | 100000010010001 | 1 | 010000000000100 | 3 |
| 038 | 001000000000010 | 2 | 010000001000001 | 1 | 100000001001001 | 1 | 100000000010000 | 3 |
| 039 | 000100100000001 | 1 | 010000001000001 | 1 | 100000100010001 | 1 | 010000000001000 | 3 |
| 040 | 000100010000000 | 4 | 001000000100001 | 1 | 100000010001001 | 1 | 001000000000100 | 3 |
| 041 | 010000100010001 | 1 | 000000000100001 | 1 | 100010010000001 | 1 | 100100100000100 | 3 |
| 042 | 000100010000001 | 1 | 000000001000001 | 1 | 100001001000001 | 1 | 100010010000100 | 3 |
| 043 | 000000100010000 | 3 | 000000010000001 | 1 | 100000100100001 | 1 | 100001001000100 | 3 |
| 044 | 010010000100000 | 4 | 001000000000010 | 2 | 000100010000001 | 1 | 100000100100100 | 3 |
| 045 | 000001001000001 | 1 | 000100000000010 | 2 | 100010001000001 | 1 | 010000000010000 | 3 |
| 046 | 000000010001000 | 3 | 010010010000010 | 2 | 100001000100001 | 1 | 001000000001000 | 3 |
| 047 | 000000100100001 | 1 | 010001001000010 | 2 | 000010100000001 | 1 | 100100100000100 | 3 |
| 048 | 000000010000100 | 3 | 010000100100010 | 2 | 100010001000001 | 1 | 100100010000100 | 3 |
| 049 | 000000001000010 | 2 | 010000010010010 | 2 | 100010000100001 | 1 | 100010010001000 | 3 |
| 050 | 010010000001001 | 1 | 000010000000010 | 2 | 001001001000001 | 1 | 100010001000100 | 3 |
| 051 | 010010000000100 | 3 | 010010001000010 | 2 | 001000100100001 | 1 | 100100010010000 | 3 |
| 052 | 000010001000000 | 4 | 010001000100010 | 2 | 000001000000001 | 1 | 100100001001000 | 3 |
| 053 | 000100000000010 | 2 | 010000100010010 | 2 | 100100000100001 | 1 | 100100000100100 | 3 |
| 054 | 000001000100000 | 4 | 001001001000010 | 2 | 001001000100001 | 1 | 010010010010000 | 3 |
| 055 | 010000010001001 | 1 | 001001000100010 | 2 | 000100100100001 | 1 | 100000010010000 | 3 |
| 056 | 000001000010000 | 3 | 001000010010010 | 2 | 000100100000001 | 1 | 100000001001000 | 3 |
| 057 | 001001000100000 | 4 | 000001000000010 | 2 | 000010010000001 | 1 | 100000000100100 | 3 |
| 058 | 000001000001000 | 3 | 010010000000010 | 2 | 000001001000001 | 1 | 100000100010000 | 3 |
| 059 | 000000100000100 | 3 | 001001000100010 | 2 | 000000100100001 | 1 | 100000010010000 | 3 |
| 060 | 000000000010010 | 2 | 000100100000010 | 2 | 100010000000001 | 1 | 100000001000100 | 3 |

FIG. 11B

| DATA SYMBOL | MCG1 Code Word MSB　　　LSB | NCG | MCG2 Code Word MSB　　　LSB | NCG | MCG3 Code Word MSB　　　LSB | NCG | MCG4 Code Word MSB　　　LSB | NCG |
|---|---|---|---|---|---|---|---|---|
| 061 | 001001000001001 | 1 | 000010010000010 | 2 | 001000100000001 | 1 | 010000010010000 | 3 |
| 062 | 001001000000100 | 3 | 000001001000010 | 2 | 000100010000001 | 1 | 010000001001000 | 3 |
| 063 | 010010010000010 | 2 | 000000100100010 | 2 | 000010001000001 | 1 | 010000000100100 | 3 |
| 064 | 001001001000001 | 1 | 000000010010010 | 2 | 000001000100001 | 1 | 001000100000000 | 4 |
| 065 | 000100100100000 | 4 | 010001000000010 | 2 | 100001000000001 | 1 | 010000100000000 | 4 |
| 066 | 001001000000010 | 2 | 001000100000010 | 2 | 001000010000001 | 1 | 001000010000000 | 4 |
| 067 | 010001001000010 | 2 | 000100010000010 | 2 | 000100001000001 | 1 | 100100100000000 | 4 |
| 068 | 001000100100001 | 1 | 000010001000010 | 2 | 000010000100001 | 1 | 100010010000000 | 4 |
| 069 | 000000100000000 | 4 | 000001000100010 | 2 | 100000100000001 | 1 | 100001001000000 | 4 |
| 070 | 000000010010001 | 1 | 000000100010010 | 2 | 001000001000001 | 1 | 100000100100000 | 4 |
| 071 | 010000100100010 | 2 | 010000100000010 | 2 | 000100000100001 | 1 | 100100010000000 | 4 |
| 072 | 001000010010001 | 1 | 001000010000010 | 2 | 100000010000001 | 1 | 100010001000000 | 4 |
| 073 | 010000010001000 | 3 | 000100001000010 | 2 | 001000000100001 | 1 | 100001000100000 | 4 |
| 074 | 010000010010010 | 2 | 000010000100010 | 2 | 100010010000010 | 2 | 010010010000000 | 4 |
| 075 | 001000001001001 | 1 | 000001000010010 | 2 | 100001001000010 | 2 | 010001001000000 | 4 |
| 076 | 010000001000100 | 3 | 010000000010010 | 2 | 100000100100010 | 2 | 010000100100000 | 4 |
| 077 | 000010000000010 | 2 | 010000000100010 | 2 | 100000010010010 | 2 | 100100001000000 | 4 |
| 078 | 000001000000001 | 1 | 001000000010010 | 2 | 000100000000010 | 2 | 100010000100000 | 4 |
| 079 | 001000010010000 | 3 | 010000001000010 | 2 | 100010001000010 | 2 | 010010001000000 | 4 |
| 080 | 010000000100010 | 2 | 001000000100010 | 2 | 100001000100010 | 2 | 010001000100000 | 4 |
| 081 | 010000000010001 | 1 | 000100000010010 | 2 | 100000100010010 | 2 | 001001010000000 | 4 |
| 082 | 010000000000100 | 3 | 010000010000010 | 2 | 000010000000010 | 2 | 100100000001001 | 1 |
| 083 | 000100100000010 | 2 | 001000001000010 | 2 | 100100001000010 | 2 | 100000000001001 | 1 |
| 084 | 001000001001000 | 3 | 000100000100010 | 2 | 100010000100010 | 2 | 100000000010001 | 1 |
| 085 | 000000001001001 | 1 | 000010000010010 | 2 | 100001000010010 | 2 | 010000000001001 | 1 |
| 086 | 001000000100100 | 3 | 000000001000010 | 2 | 100000100010010 | 2 | 010000000010001 | 1 |
| 087 | 010000100000000 | 4 | 010010000010010 | 2 | 001000100100010 | 2 | 001000000001001 | 1 |
| 088 | 001000000010010 | 2 | 001001000010010 | 2 | 001000010010010 | 2 | 100100100001001 | 1 |
| 089 | 001000000001001 | 1 | 000100100010010 | 2 | 000001000000010 | 2 | 100010010001001 | 1 |
| 090 | 010000000001000 | 3 | 000010010010010 | 2 | 001001000000010 | 2 | 100001001001001 | 1 |
| 091 | 000010010000010 | 2 | 000000010000010 | 2 | 000010010000010 | 2 | 001000000010001 | 1 |
| 092 | 010001000000001 | 1 | 010010000100010 | 2 | 000001001000010 | 2 | 100000010010001 | 1 |
| 093 | 010010001001000 | 3 | 010000100010010 | 2 | 000000100100010 | 2 | 100000001001001 | 1 |
| 094 | 010010001000010 | 2 | 001001000100010 | 2 | 100010000000010 | 2 | 100000100010001 | 1 |
| 095 | 000001001000010 | 2 | 001000100010010 | 2 | 001000100000010 | 2 | 100000010001001 | 1 |
| 096 | 001000100000001 | 1 | 000100100100010 | 2 | 000100010000010 | 2 | 010000010010001 | 1 |
| 097 | 010010000100100 | 3 | 000100010010010 | 2 | 000010001000010 | 2 | 010000001001001 | 1 |
| 098 | 010010000100001 | 1 | 000000100000010 | 2 | 000001000100010 | 2 | 100100001000001 | 1 |
| 099 | 000000100100010 | 2 | 010000000000100 | 3 | 000000001000010 | 2 | 100010000100001 | 1 |
| 100 | 000100010000001 | 1 | 010000000001000 | 3 | 100000100000010 | 2 | 010010001000001 | 1 |
| 101 | 001001001001000 | 3 | 001000000000100 | 3 | 001000100000010 | 2 | 010001000100001 | 1 |
| 102 | 000000010000000 | 4 | 010000000010000 | 3 | 000100001000010 | 2 | 001001001000001 | 1 |
| 103 | 001001000010010 | 2 | 001000000001000 | 3 | 000010000100010 | 2 | 001000100100001 | 1 |
| 104 | 000100100001001 | 1 | 000100000000100 | 3 | 000001000100010 | 2 | 100100000100001 | 1 |
| 105 | 000100100000100 | 3 | 010010010000100 | 3 | 100000001000010 | 2 | 010010000100001 | 1 |
| 106 | 010001000010000 | 3 | 010001001000100 | 3 | 001000000010010 | 2 | 001001000100001 | 1 |
| 107 | 000010001000001 | 1 | 010000100100100 | 3 | 100010100010010 | 2 | 100010000000001 | 1 |
| 108 | 010000100001000 | 3 | 001000000010000 | 3 | 100000010000010 | 2 | 010001000000001 | 1 |
| 109 | 001010010000000 | 4 | 000010000001000 | 3 | 001000000010010 | 2 | 001000100000001 | 1 |
| 110 | 010000001000010 | 2 | 000010010000000 | 3 | 000100000010010 | 2 | 100010000000001 | 1 |
| 111 | 010000000100001 | 1 | 010010000000100 | 3 | 100000100000010 | 2 | 010000100000001 | 1 |
| 112 | 001000000000100 | 3 | 001001000000100 | 3 | 001000001000010 | 2 | 001000010000001 | 1 |
| 113 | 000001000100001 | 1 | 000100100000100 | 3 | 000100000100010 | 2 | 100000100000001 | 1 |
| 114 | 001001000100100 | 3 | 000010010000100 | 3 | 000010000100010 | 2 | 010000010000001 | 1 |
| 115 | 010001000100010 | 2 | 000000100100100 | 3 | 000010010010010 | 2 | 001000001000001 | 1 |
| 116 | 000000100010001 | 1 | 000000100100100 | 3 | 100100000100010 | 2 | 100000001000001 | 1 |
| 117 | 000100100100100 | 3 | 010010000001000 | 3 | 100010000010010 | 2 | 010000000100001 | 1 |
| 118 | 010001000010001 | 1 | 010001000000100 | 3 | 001001000100010 | 2 | 100010010000001 | 1 |
| 119 | 000000010001001 | 1 | 001001000001000 | 3 | 001000100010010 | 2 | 010001000000001 | 1 |
| 120 | 000010000010000 | 3 | 001000100000100 | 3 | 000100100000010 | 2 | 001000000100001 | 1 |

FIG. 11C

| DATA SYMBOL | MCG1 Code Word MSB LSB | NCG | MCG2 Code Word MSB LSB | NCG | MCG3 Code Word MSB LSB | NCG | MCG4 Code Word MSB LSB | NCG |
|---|---|---|---|---|---|---|---|---|
| 121 | 000000000100000 | 4 | 000100100001000 | 3 | 000100010010010 | 2 | 010000100100010 | 2 |
| 122 | 000100100010010 | 2 | 000100010000100 | 3 | 000000100000010 | 2 | 010000010010010 | 2 |
| 123 | 000100010001001 | 1 | 000010010001000 | 3 | 100000000001000 | 3 | 100100001000010 | 2 |
| 124 | 000010010000100 | 3 | 000010001000100 | 3 | 100000000010000 | 3 | 100010000100010 | 2 |
| 125 | 010000010000100 | 3 | 000001001001000 | 3 | 001000000000100 | 3 | 100001000010010 | 2 |
| 126 | 000100001000000 | 4 | 000001000100100 | 3 | 100010010000100 | 3 | 010010001000010 | 2 |
| 127 | 001000000100010 | 2 | 010000010010000 | 3 | 100001001000100 | 3 | 010001000100010 | 2 |
| 128 | 001000000010001 | 1 | 010000001001000 | 3 | 100000100100100 | 3 | 010000100010010 | 2 |
| 129 | 010000000010000 | 3 | 010000000100100 | 3 | 001000000001000 | 3 | 001001001000010 | 2 |
| 130 | 000001000001000 | 3 | 010000100010000 | 3 | 000100000000100 | 3 | 001000100100010 | 2 |
| 131 | 010000100010010 | 2 | 010000010001000 | 3 | 100010010001000 | 3 | 001000010010010 | 2 |
| 132 | 000000100000100 | 3 | 010000001000100 | 3 | 100010001000100 | 3 | 001001000000010 | 2 |
| 133 | 010000100001001 | 1 | 001000010010000 | 3 | 100001001001000 | 3 | 100010000000010 | 2 |
| 134 | 010010010001000 | 3 | 001000001001000 | 3 | 100001000100100 | 3 | 010001000000010 | 2 |
| 135 | 000000001000000 | 4 | 001000000100100 | 3 | 001000000010000 | 3 | 001000100000010 | 2 |
| 136 | 000010010010010 | 2 | 010000100010000 | 3 | 000100000001000 | 3 | 100001000000010 | 2 |
| 137 | 000001001001001 | 1 | 010000100001000 | 3 | 000010000000100 | 3 | 010000100000010 | 2 |
| 138 | 000001001000100 | 3 | 010000010000100 | 3 | 000010100000100 | 3 | 001000010000010 | 2 |
| 139 | 000100000010010 | 2 | 001000100010000 | 3 | 000001001000100 | 3 | 001000000010010 | 2 |
| 140 | 000100000001001 | 1 | 001000010001000 | 3 | 000000100100100 | 3 | 100010010010010 | 2 |
| 141 | 001000000001000 | 3 | 001000001000100 | 3 | 100100000001000 | 3 | 100000010000010 | 2 |
| 142 | 001001001000010 | 2 | 000100010010000 | 3 | 100001001000000 | 3 | 010000001000010 | 2 |
| 143 | 001001000100001 | 1 | 000100001001000 | 3 | 001001000001000 | 3 | 001000000100010 | 2 |
| 144 | 001000100010000 | 3 | 000100000100100 | 3 | 001000100000100 | 3 | 100100010010010 | 2 |
| 145 | 000000010010010 | 2 | 010001000010000 | 3 | 000100100001000 | 3 | 100000100000010 | 2 |
| 146 | 010001001001001 | 1 | 010001000001000 | 3 | 000100010000100 | 3 | 010010100010010 | 2 |
| 147 | 000100000000100 | 3 | 010000100100000 | 3 | 000010010000100 | 3 | 010000010000010 | 2 |
| 148 | 001000100100010 | 2 | 001001000010000 | 3 | 000010001000100 | 3 | 001001001000010 | 2 |
| 149 | 001000100010001 | 1 | 001001000001000 | 3 | 000001001001000 | 3 | 001001000010010 | 2 |
| 150 | 001000010001000 | 3 | 001000010000100 | 3 | 000001000100100 | 3 | 100100000100010 | 2 |
| 151 | 010000100000001 | 1 | 000100100010000 | 3 | 100000010010000 | 3 | 100010000010010 | 2 |
| 152 | 010010010000100 | 3 | 000100010001000 | 3 | 001000010010000 | 3 | 010010000100010 | 2 |
| 153 | 001000010010010 | 2 | 000100001000100 | 3 | 001000001001000 | 3 | 010001000010010 | 2 |
| 154 | 001000010001001 | 1 | 000010100010000 | 3 | 001000000100100 | 3 | 001001000100010 | 2 |
| 155 | 001000001000100 | 3 | 000010001001000 | 3 | 100010000010000 | 3 | 001000100010010 | 2 |
| 156 | 000010000100000 | 4 | 000010000100100 | 3 | 100001000001000 | 3 | 100001001001010 | 3 |
| 157 | 010000010000010 | 2 | 000000010010000 | 3 | 100000100000100 | 3 | 100001000100100 | 3 |
| 158 | 010000001000001 | 1 | 000000001001000 | 3 | 001000100010000 | 3 | 010010010000100 | 3 |
| 159 | 010000000100000 | 4 | 000000000100100 | 3 | 001000010001000 | 3 | 010001001000100 | 3 |
| 160 | 000100100010000 | 3 | 000000100010000 | 3 | 001000001000100 | 3 | 010000100100100 | 3 |
| 161 | 000000100100100 | 3 | 000000010001000 | 3 | 000100010010000 | 3 | 001001000010010 | 3 |
| 162 | 000100100100001 | 1 | 000000001000100 | 3 | 000100001001000 | 3 | 010010000000100 | 3 |
| 163 | 000100001001000 | 3 | 000001000010000 | 3 | 000100000100100 | 3 | 001001000000100 | 3 |
| 164 | 010001000000010 | 2 | 000000100001000 | 3 | 100100000010000 | 3 | 100100000001000 | 3 |
| 165 | 001000001000010 | 2 | 000000010000100 | 3 | 100010000001000 | 3 | 100010000000100 | 3 |
| 166 | 001000010000001 | 1 | 010010010010000 | 3 | 100001000000100 | 3 | 010010000001000 | 3 |
| 167 | 001000000100001 | 1 | 010010001001000 | 3 | 001001000010000 | 3 | 010001000000100 | 3 |
| 168 | 010010001000100 | 3 | 010010000100100 | 3 | 001000100001000 | 3 | 001001000001000 | 3 |
| 169 | 010001001000100 | 3 | 001001001001000 | 3 | 001000010000100 | 3 | 001000100000100 | 3 |
| 170 | 000000001000001 | 1 | 010010100001000 | 3 | 000100100010000 | 3 | 100001000010000 | 3 |
| 171 | 000100000100100 | 3 | 000100100100100 | 3 | 000100100001000 | 3 | 100000100100000 | 3 |
| 172 | 010010000001000 | 3 | 000010000010000 | 3 | 000100001000100 | 3 | 100000010000100 | 3 |
| 173 | 010010000010000 | 3 | 000001000001000 | 3 | 000100010010000 | 3 | 010000100010000 | 3 |
| 174 | 001000100000010 | 2 | 000000100000100 | 3 | 000010001001000 | 3 | 010000010001000 | 3 |
| 175 | 000100000100010 | 2 | 010010010010000 | 3 | 000010000100100 | 3 | 010000001000100 | 3 |
| 176 | 000100001000001 | 1 | 010010001000100 | 3 | 000001000010000 | 3 | 001000100010000 | 3 |
| 177 | 000100000010001 | 1 | 010001001001000 | 3 | 000000100001000 | 3 | 001000001001000 | 3 |
| 178 | 010001001001000 | 3 | 010001000100100 | 3 | 100100001001000 | 3 | 001000000100100 | 3 |
| 179 | 010000100100100 | 3 | 001001001000100 | 3 | 100100000100100 | 3 | 100010000010000 | 3 |
| 180 | 010001000000100 | 3 | 001000100100100 | 3 | 001001001001000 | 3 | 100001000001000 | 3 |

FIG. 11D

| DATA SYMBOL | MCG1 Code Word MSB LSB | NCG | MCG2 Code Word MSB LSB | NCG | MCG3 Code Word MSB LSB | NCG | MCG4 Code Word MSB LSB | NCG |
|---|---|---|---|---|---|---|---|---|
| 181 | 000100010000010 | 2 | 000100000010000 | 3 | 001001000100100 | 3 | 100000100000100 | 3 |
| 182 | 000010000100001 | 1 | 000010000001000 | 3 | 000100100100100 | 3 | 010001000010000 | 3 |
| 183 | 010001000100100 | 3 | 000001000000100 | 3 | 000010000010000 | 3 | 010000100001000 | 3 |
| 184 | 000001000000010 | 2 | 010000000100000 | 4 | 000001000000100 | 3 | 010000010000100 | 3 |
| 185 | 000000010000010 | 2 | 000000000100000 | 4 | 000000100000100 | 3 | 001000100010000 | 3 |
| 186 | 000100010010001 | 1 | 000000001000000 | 4 | 100100001000100 | 3 | 001000010001000 | 3 |
| 187 | 010010000010001 | 1 | 010010010000000 | 4 | 100100010010000 | 3 | 001000001000100 | 3 |
| 188 | 010001000001000 | 3 | 010001001000000 | 4 | 100010001001000 | 3 | 100100000010000 | 3 |
| 189 | 000010001000010 | 2 | 010000100100000 | 4 | 100010000100100 | 3 | 100010000001000 | 3 |
| 190 | 000100001001001 | 1 | 010010001000000 | 4 | 001001000100100 | 3 | 100001000000100 | 3 |
| 191 | 010000100000100 | 3 | 010001000100000 | 4 | 001000100100100 | 3 | 010010000010000 | 3 |
| 192 | 000001000100010 | 2 | 001001001000000 | 4 | 000100000010000 | 3 | 010001000001000 | 3 |
| 193 | 000010000010010 | 2 | 001000100100000 | 4 | 000010000001000 | 3 | 010000100000100 | 3 |
| 194 | 000001000010001 | 1 | 010010000100000 | 4 | 000001000000100 | 3 | 001001000010000 | 3 |
| 195 | 000010000001001 | 1 | 001001000100000 | 4 | 100000000100000 | 4 | 001001000001000 | 3 |
| 196 | 001001001000100 | 3 | 000001001000000 | 4 | 100010001000000 | 4 | 001000010000100 | 3 |
| 197 | 001000000010000 | 3 | 000000100100000 | 4 | 100001000100000 | 4 | 010010001001000 | 3 |
| 198 | 001001000010000 | 3 | 001000100000000 | 4 | 100100001000000 | 4 | 010010000100100 | 3 |
| 199 | 000000100010010 | 2 | 000100010000000 | 4 | 100010000100000 | 4 | 001001001001000 | 3 |
| 200 | 010000100000010 | 2 | 000010001000000 | 4 | 001001001000000 | 4 | 001001000100100 | 3 |
| 201 | 000000100001001 | 1 | 000001000100000 | 4 | 001000100100000 | 4 | 100100100010000 | 3 |
| 202 | 010010001001001 | 1 | 010000100000000 | 4 | 100100000100000 | 4 | 100100010001000 | 3 |
| 203 | 001000100100100 | 3 | 001000010000000 | 4 | 001001000100000 | 4 | 100100001000100 | 3 |
| 204 | 000100000001000 | 3 | 000100001000000 | 4 | 000100100100000 | 4 | 100010010010000 | 3 |
| 205 | 001000010000010 | 2 | 000010000100000 | 4 | 000000100000000 | 4 | 100010001001000 | 3 |
| 206 | 010000010000001 | 1 | 010000010000000 | 4 | 001000100000000 | 4 | 100010000100100 | 3 |
| 207 | 001000000010000 | 3 | 001000010000000 | 4 | 000100010000000 | 4 | 010100010001000 | 3 |
| 208 | 010010000100010 | 2 | 000100000100000 | 4 | 000010001000000 | 4 | 010100010001000 | 3 |
| 209 | 010001000010010 | 2 | 010000001000000 | 4 | 000001000100000 | 4 | 010001001001000 | 3 |
| 210 | 000000100000001 | 1 | 001000000100000 | 4 | 001000010000000 | 4 | 010001000100100 | 3 |
| 211 | 010001000001001 | 1 | 010000010010001 | 1 | 000100001010000 | 4 | 001001001000100 | 3 |
| 212 | 001000100000100 | 3 | 010000001001001 | 1 | 000010000100000 | 4 | 001000100100100 | 3 |
| 213 | 001001000001000 | 3 | 010000100010001 | 1 | 100000100000000 | 4 | 100000000100000 | 4 |
| 214 | 000100001000010 | 2 | 010000010001001 | 1 | 001000001000000 | 4 | 100000001000000 | 4 |
| 215 | 001001001001001 | 1 | 001000010010001 | 1 | 000100000100000 | 4 | 010000000100000 | 4 |
| 216 | 001000001000001 | 1 | 001000001001001 | 1 | 100000010000000 | 4 | 001000100100000 | 4 |
| 217 | 000010000001000 | 3 | 010001000010001 | 1 | 001000000100000 | 4 | 100100100100000 | 4 |
| 218 | 000010000000100 | 3 | 010000100001001 | 1 | 100001000010001 | 1 | 010010000100000 | 4 |
| 219 | 000010000100010 | 2 | 001000100010001 | 1 | 100000100001001 | 1 | 001001000100000 | 4 |
| 220 | 000100000100001 | 1 | 001000010001001 | 1 | 001000010010001 | 1 | 100000100000000 | 4 |
| 221 | 000010000010001 | 1 | 000100010010001 | 1 | 001000001001001 | 1 | 010000010000000 | 4 |
| 222 | 000001000000100 | 3 | 000010001001001 | 1 | 100010000010001 | 1 | 001001000000000 | 4 |
| 223 | 001000010000100 | 3 | 010000000100001 | 1 | 100001000001001 | 1 | 100000010000000 | 4 |
| 224 | 000001000001001 | 1 | 010000000010001 | 1 | 001000100010001 | 1 | 010000001000000 | 4 |
| 225 | 010000010000000 | 4 | 001000000001001 | 1 | 001000010001001 | 1 | 001000000100000 | 4 |
| 226 | 001001000100010 | 2 | 001000000010001 | 1 | 000100010010001 | 1 | 100001000010001 | 1 |
| 227 | 001001000100010 | 2 | 000100000001001 | 1 | 000100001001001 | 1 | 100000100001001 | 1 |
| 228 | 001001000010001 | 1 | 010010010001001 | 1 | 100000000001001 | 1 | 010000100010001 | 1 |
| 229 | 001000100001001 | 1 | 010001001001001 | 1 | 100000000010001 | 1 | 010000010001001 | 1 |
| 230 | 000100100010000 | 3 | 000100000010001 | 1 | 001001000001001 | 1 | 001000010010001 | 1 |
| 231 | 001001000001000 | 3 | 000010000001001 | 1 | 100010010010001 | 1 | 001000010010001 | 1 |
| 232 | 000100010001000 | 3 | 010010000001001 | 1 | 100010010010001 | 1 | 100010010010001 | 1 |
| 233 | 010000001000000 | 4 | 001000000010001 | 1 | 001000000010001 | 1 | 100001000010001 | 1 |
| 234 | 000100001000100 | 3 | 000100100001001 | 1 | 000000001001001 | 1 | 010010001001001 | 1 |
| 235 | 000010010010000 | 3 | 000010010001001 | 1 | 100010010010001 | 1 | 010000100001001 | 1 |
| 236 | 000100000100000 | 4 | 000001001001001 | 1 | 100010001001001 | 1 | 001000100010001 | 1 |
| 237 | 000010001001000 | 3 | 010010000010001 | 1 | 000100000010001 | 1 | 001000010001001 | 1 |
| 238 | 010000001000000 | 4 | 010010000001001 | 1 | 000010010000001 | 1 | 100100010001001 | 1 |
| 239 | 000100100010010 | 2 | 001001000010001 | 1 | 000010010001001 | 1 | 100010010010001 | 1 |
| 240 | 000100010010010 | 2 | 001000100001001 | 1 | 000001001001001 | 1 | 100010001001001 | 1 |

FIG. 11E

| DATA SYMBOL | MCG1 | | MCG2 | | MCG3 | | MCG4 | |
|---|---|---|---|---|---|---|---|---|
| | Code Word MSB　　LSB | NCG | Code Word MSB　　LSB | NCG | Code Word MSB　　LSB | NCG | Code Word MSB　　LSB | NCG |
| 241 | 000100100010001 | 1 | 000100100010001 | 1 | 100100000010001 | 1 | 010010010001001 | 1 |
| 242 | 000100010001001 | 1 | 000100010001001 | 1 | 100010000001001 | 1 | 010001001001001 | 1 |
| 243 | 000010000100100 | 3 | 000010010010001 | 1 | 001001000010001 | 1 | 010010000001001 | 1 |
| 244 | 000100100001000 | 3 | 000010001001001 | 1 | 001000100001001 | 1 | 001001000001001 | 1 |
| 245 | 001000000100000 | 4 | 000000010010001 | 1 | 000100100010001 | 1 | 100100000010001 | 1 |
| 246 | 000010010010001 | 1 | 000000001001001 | 1 | 000100010001001 | 1 | 100010000001001 | 1 |
| 247 | 000000100000010 | 2 | 000000100010001 | 1 | 000010010010001 | 1 | 010010000010001 | 1 |
| 248 | 000010001001001 | 1 | 000000010001001 | 1 | 000010001001001 | 1 | 010001000001001 | 1 |
| 249 | 000100010000100 | 3 | 000001000010001 | 1 | 000000100010001 | 1 | 001001000010001 | 1 |
| 250 | 000001000010010 | 2 | 000000100001001 | 1 | 000000100001001 | 1 | 001000100001001 | 1 |
| 251 | 000010010001001 | 3 | 010010010010001 | 1 | 000000010001001 | 1 | 100010010010001 | 1 |
| 252 | 000010001000100 | 3 | 010010001001001 | 1 | 100100001001001 | 1 | 100100001001001 | 1 |
| 253 | 000010001001000 | 3 | 001001001001001 | 1 | 001001001001001 | 1 | 010010010010001 | 1 |
| 254 | 000000010000001 | 1 | 000010000010001 | 1 | 000010000010001 | 1 | 010010001001001 | 1 |
| 255 | 000001000100100 | 3 | 000001000001001 | 1 | 000001000001001 | 1 | 001001001001001 | 1 |

FIG. 12A

| DATA SYMBOL | DCG11 Code Word MSB LSB | NCG | DCG12 Code Word MSB LSB | NCG | DCG21 Code Word MSB LSB | NCG | DCG22 Code Word MSB LSB | NCG |
|---|---|---|---|---|---|---|---|---|
| 000 | 00100100100000001 | 1 | 00100100000000001 | 1 | 01001001000000001 | 1 | 00100100000000001 | 1 |
| 001 | 00100100010000001 | 1 | 00010010000000001 | 1 | 01000100100000001 | 1 | 00010010000000001 | 1 |
| 002 | 00100001001000001 | 1 | 00001001000000001 | 1 | 01000010010000001 | 1 | 00001001000000001 | 1 |
| 003 | 00100000100100001 | 1 | 00000100100000001 | 1 | 01000001001000001 | 1 | 00000100100000001 | 1 |
| 004 | 00000100000000001 | 1 | 00000010010000001 | 1 | 01000000100100001 | 1 | 00000010010000001 | 1 |
| 005 | 00100100010000001 | 1 | 00000001001000001 | 1 | 01001000100000001 | 1 | 00000001001000001 | 1 |
| 006 | 00100010001000001 | 1 | 00000000100100001 | 1 | 01000100010000001 | 1 | 00000000100100001 | 1 |
| 007 | 00100001000100001 | 1 | 00100010000000001 | 1 | 01000010001000001 | 1 | 01000100000000001 | 1 |
| 008 | 00010010010000001 | 1 | 00010001000000001 | 1 | 01000001000100001 | 1 | 00100010000000001 | 1 |
| 009 | 00010001001000001 | 1 | 00001000100000001 | 1 | 00100100100000001 | 1 | 00010001000000001 | 1 |
| 010 | 00010000100100001 | 1 | 00000100010000001 | 1 | 00100010010000001 | 1 | 00001000100000001 | 1 |
| 011 | 00000010000000001 | 1 | 00000010001000001 | 1 | 00100001001000001 | 1 | 00000100010000001 | 1 |
| 012 | 00100100001000001 | 1 | 00000001000100001 | 1 | 00100000100100001 | 1 | 00000010001000001 | 1 |
| 013 | 00100010000100001 | 1 | 00100010000000001 | 1 | 00000100000000001 | 1 | 00000001000100001 | 1 |
| 014 | 00010010001000001 | 1 | 00010001000000001 | 1 | 01001000010000001 | 1 | 01000010000000001 | 1 |
| 015 | 00010001000100001 | 1 | 00001000100000001 | 1 | 01000100001000001 | 1 | 00100001000000001 | 1 |
| 016 | 00001001001000001 | 1 | 00000100001000001 | 1 | 01000010000100001 | 1 | 00010000100000001 | 1 |
| 017 | 00001000100100001 | 1 | 00000010000100001 | 1 | 00100100010000001 | 1 | 00001000010000001 | 1 |
| 018 | 00000001000000001 | 1 | 00100100010000001 | 1 | 00100010001000001 | 1 | 00000100000100001 | 1 |
| 019 | 00000000100000001 | 1 | 00100000100000001 | 1 | 00100001000100001 | 1 | 00000010000100001 | 1 |
| 020 | 00000000010000001 | 1 | 00010000010000001 | 1 | 00010010010000001 | 1 | 01001001001000001 | 1 |
| 021 | 00100100000100001 | 1 | 00001000001000001 | 1 | 00010001001000001 | 1 | 01001000100100001 | 1 |
| 022 | 00010010000100001 | 1 | 00000100000100001 | 1 | 00010000100100001 | 1 | 01000100100100001 | 1 |
| 023 | 00001001000100001 | 1 | 00100000000100001 | 1 | 01001000001000001 | 1 | 00100000100000001 | 1 |
| 024 | 00000100100100001 | 1 | 00010000001000001 | 1 | 01000100000100001 | 1 | 00010000010000001 | 1 |
| 025 | 00000000100100001 | 1 | 00010000000100001 | 1 | 01000100000100001 | 1 | 00001000001000001 | 1 |
| 026 | 00001000000000010 | 2 | 00100100000000010 | 2 | 00100100001000001 | 1 | 00000100000100001 | 1 |
| 027 | 00100100100000010 | 2 | 00010010000000010 | 2 | 00100010000100001 | 1 | 01001001000100001 | 1 |
| 028 | 00100010010000010 | 2 | 00001001000000010 | 2 | 00010010001000001 | 1 | 01000100100100001 | 1 |
| 029 | 00100001001000010 | 2 | 00000100100000010 | 2 | 00010001000100001 | 1 | 01000000100100001 | 1 |
| 030 | 00100000100100010 | 2 | 00000010010000010 | 2 | 00001001001000001 | 1 | 00100000010000001 | 1 |
| 031 | 00100000010010010 | 2 | 00000001001000010 | 2 | 00001000100100001 | 1 | 00010000001000001 | 1 |
| 032 | 00000100000000010 | 2 | 00000000100100010 | 2 | 00000001000000001 | 1 | 00001000000100001 | 1 |
| 033 | 00100100010000010 | 2 | 00000000010010010 | 2 | 00000000010000001 | 1 | 01000000000100001 | 1 |
| 034 | 00100010001000010 | 2 | 00100010000000010 | 2 | 01001000000100001 | 1 | 01000000000100001 | 1 |
| 035 | 00100001000100010 | 2 | 00010001000000010 | 2 | 00100100000100001 | 1 | 01000000001000001 | 1 |
| 036 | 00100000100010010 | 2 | 00001000100000010 | 2 | 00010010000100001 | 1 | 00100000000100001 | 1 |
| 037 | 00010010010000010 | 2 | 00000100010000010 | 2 | 00001001000100001 | 1 | 01000000010000001 | 1 |
| 038 | 00010010001000010 | 2 | 00000010001000010 | 2 | 00000100100100001 | 1 | 00100000001000001 | 1 |
| 039 | 00010001000100010 | 2 | 00000001000100010 | 2 | 00000000100100001 | 1 | 00100000000100001 | 1 |
| 040 | 00010000100100010 | 2 | 00000000100010010 | 2 | 01001001000000010 | 2 | 01001000000000010 | 2 |
| 041 | 00000010000000010 | 2 | 00100001000000010 | 2 | 01000100100000010 | 2 | 00100100000000010 | 2 |
| 042 | 00000000001000000010 | 2 | 00010000100000010 | 2 | 01000100100000010 | 2 | 00010010000000010 | 2 |
| 043 | 00100100000010010 | 2 | 00001000010000010 | 2 | 01000001001000010 | 2 | 00001001000000010 | 2 |
| 044 | 00010010000010010 | 2 | 00000100001000010 | 2 | 01000000100100010 | 2 | 00000100100000010 | 2 |
| 045 | 00001001000010010 | 2 | 00000010000100010 | 2 | 01000000010010010 | 2 | 00000010010000010 | 2 |
| 046 | 00000100100010010 | 2 | 00000001000010010 | 2 | 00001000000000010 | 2 | 00000001001000010 | 2 |
| 047 | 00000010010010010 | 2 | 00100100100100010 | 2 | 01001000100000010 | 2 | 00000000100100010 | 2 |
| 048 | 00000000010000010 | 2 | 00100100100010010 | 2 | 01000100010000010 | 2 | 01000100000000010 | 2 |
| 049 | 00100100000100010 | 2 | 00100000100000010 | 2 | 01000010001000010 | 2 | 00100010000000010 | 2 |
| 050 | 00100010000100010 | 2 | 00010010010010010 | 2 | 01000001000100010 | 2 | 00100100000000010 | 2 |
| 051 | 00010010000100010 | 2 | 00010000100000010 | 2 | 01000000100010010 | 2 | 00001001000000010 | 2 |
| 052 | 00010001000100010 | 2 | 00001000010000010 | 2 | 00100100100000010 | 2 | 00001000100000010 | 2 |
| 053 | 00001001000100010 | 2 | 00000100001000010 | 2 | 00100010010000010 | 2 | 00000010010000010 | 2 |
| 054 | 00001000100100010 | 2 | 00000010000100010 | 2 | 00100001001000010 | 2 | 00000001000100010 | 2 |
| 055 | 00000100100100010 | 2 | 00100000000010010 | 2 | 00100000100100010 | 2 | 00000000100100010 | 2 |
| 056 | 00000100100010010 | 2 | 00100000000100010 | 2 | 00100000010010010 | 2 | 00000000100100010 | 2 |
| 057 | 00000000100000010 | 2 | 00010000000100010 | 2 | 00000100000000010 | 2 | 01000100000000010 | 2 |
| 058 | 00100100001000010 | 2 | 00100000001000010 | 2 | 01001000001000010 | 2 | 00100000100000010 | 2 |
| 059 | 00100100001000010 | 2 | 00010000000100010 | 2 | 01000100001000010 | 2 | 00010000100000010 | 2 |
| 060 | 00100001000010010 | 2 | 00001000000010010 | 2 | 01000010000100010 | 2 | 00001000100000010 | 2 |

FIG. 12B

| DATA SYMBOL | DCG11 Code Word MSB LSB | NCG | DCG12 Code Word MSB LSB | NCG | DCG21 Code Word MSB LSB | NCG | DCG22 Code Word MSB LSB | NCG |
|---|---|---|---|---|---|---|---|---|
| 061 | 000100100010000010 | 2 | 00100100100010010 | 2 | 010000010000010010 | 2 | 00000100001000010 | 2 |
| 062 | 000100010001000010 | 2 | 001000100100100010 | 2 | 001001000100000010 | 2 | 000000100000100010 | 2 |
| 063 | 000100000100010010 | 2 | 001000000100000010 | 2 | 001000010001000010 | 2 | 000000010000010010 | 2 |
| 064 | 000010010010000010 | 2 | 000100000001000010 | 2 | 001000010000010010 | 2 | 010010010010000010 | 2 |
| 065 | 000010000100100010 | 2 | 000010000001000010 | 2 | 001000001000100010 | 2 | 010010000100100010 | 2 |
| 066 | 000010000100100010 | 2 | 000001000000010010 | 2 | 000100100010000010 | 2 | 010010000010010010 | 2 |
| 067 | 001000000000001000 | 3 | 001001000000000100 | 3 | 000100010010010010 | 2 | 010000010000000010 | 2 |
| 068 | 000100000000000100 | 3 | 000100100100000100 | 3 | 000100000100010010 | 2 | 001001000100100010 | 2 |
| 069 | 001000000100010000 | 3 | 000010010000000100 | 3 | 000100000100010010 | 2 | 001001000100010010 | 2 |
| 070 | 000100000000001000 | 3 | 000001000100000100 | 3 | 000000100000000010 | 2 | 001000010100000010 | 2 |
| 071 | 000010000000000100 | 3 | 000000010010000100 | 3 | 010010000000100010 | 2 | 000100100100010010 | 2 |
| 072 | 001001000100000100 | 3 | 000000010010000100 | 3 | 001001000000010010 | 2 | 000100000100000010 | 2 |
| 073 | 001000100010000100 | 3 | 000000001001000100 | 3 | 001001000000010010 | 2 | 000010100000100010 | 2 |
| 074 | 001000010010010000 | 3 | 000100100000001000 | 3 | 000010010100100010 | 2 | 000001000000100010 | 2 |
| 075 | 001000000100100100 | 3 | 001000010000000100 | 3 | 000010000100100010 | 2 | 000000100000100010 | 2 |
| 076 | 000100000000010000 | 3 | 000100010000001000 | 3 | 000000010010100010 | 2 | 010000000000010010 | 2 |
| 077 | 000010000000001000 | 3 | 000100010000000100 | 3 | 000000001001000010 | 2 | 010000000000100010 | 2 |
| 078 | 000001000000000100 | 3 | 000010010000001000 | 3 | 010010000010100010 | 2 | 001000000100010010 | 2 |
| 079 | 000000100010010000 | 3 | 000010010010000010 | 3 | 010010010000000010 | 2 | 010000000010010010 | 2 |
| 080 | 000000001010001000 | 3 | 000001000100001000 | 3 | 001001000000100010 | 2 | 010000000100000010 | 2 |
| 081 | 000000001000010000 | 3 | 000001000010000100 | 3 | 001000100000010010 | 2 | 000100000000010010 | 2 |
| 082 | 000000000010001000 | 3 | 000000010010001000 | 3 | 000100100000100010 | 2 | 010010010000010010 | 2 |
| 083 | 000000000001000100 | 3 | 000000010001000100 | 3 | 000100010000010010 | 2 | 010010010100010010 | 2 |
| 084 | 000000010100100000 | 3 | 000000001001001000 | 3 | 000010010001000010 | 2 | 010000010010100010 | 2 |
| 085 | 000000000010001000 | 3 | 000000001000100100 | 3 | 000010000100010010 | 2 | 010000000100000010 | 2 |
| 086 | 000000000010000100 | 3 | 001001000000010000 | 3 | 000000100100100010 | 2 | 001000000001000010 | 2 |
| 087 | 001001000010010000 | 3 | 001000010000001000 | 3 | 000000010001000010 | 2 | 000100000000100010 | 2 |
| 088 | 001001000010010000 | 3 | 001000010000000100 | 3 | 000000001000010010 | 2 | 000010000000010010 | 2 |
| 089 | 001001010000100100 | 3 | 000100100100010000 | 3 | 010010001000100010 | 2 | 010010010001000010 | 2 |
| 090 | 000100100010010010 | 3 | 000100010001000100 | 3 | 010010010000100010 | 2 | 010010001000100010 | 2 |
| 091 | 000100100001001000 | 3 | 000010000100000100 | 3 | 010000010000010010 | 2 | 010000100100100010 | 2 |
| 092 | 000100100010010000 | 3 | 000010010000010000 | 3 | 001001000001000010 | 2 | 010000010010010010 | 2 |
| 093 | 000010010010010000 | 3 | 000010010100001000 | 3 | 001001000100100010 | 2 | 010000001010000010 | 2 |
| 094 | 000010100100010010 | 3 | 000001000100010000 | 3 | 001000001000010010 | 2 | 001000101000010010 | 2 |
| 095 | 000000100100100100 | 3 | 000001000100010000 | 3 | 000100010001000010 | 2 | 001000100100010010 | 2 |
| 096 | 000000100000010000 | 3 | 000010000100001000 | 3 | 000100010001000010 | 2 | 001000000100000010 | 2 |
| 097 | 000000010000001000 | 3 | 000010000010000100 | 3 | 000010001000010010 | 2 | 000100000000100010 | 2 |
| 098 | 000000000100000100 | 3 | 000010010001000100 | 3 | 000010010010010010 | 2 | 000010000100000010 | 2 |
| 099 | 001001000010010000 | 3 | 000000100010001000 | 3 | 000010010010010010 | 2 | 000000100000100010 | 2 |
| 100 | 001001000010001000 | 3 | 000000100010000100 | 3 | 010000000000010010 | 3 | 010010000000010100 | 3 |
| 101 | 001001000001000100 | 3 | 001000001010010000 | 3 | 001000000000001000 | 3 | 001001000000100100 | 3 |
| 102 | 001000100010010000 | 3 | 001000000010001000 | 3 | 000100000000010100 | 3 | 000100100000000100 | 3 |
| 103 | 001001000100100100 | 3 | 001000000001000100 | 3 | 010010010010000100 | 3 | 000010010010000100 | 3 |
| 104 | 001000010000100100 | 3 | 001000000100001000 | 3 | 010000100100000100 | 3 | 000001000100000100 | 3 |
| 105 | 000100100010001000 | 3 | 001000000100001000 | 3 | 010000010010000100 | 3 | 000000100010000100 | 3 |
| 106 | 000100100010000100 | 3 | 001000000001000100 | 3 | 010000010010000100 | 3 | 000000001001000100 | 3 |
| 107 | 000100010010010000 | 3 | 000100000100010000 | 3 | 010000000100100100 | 3 | 000000001000100100 | 3 |
| 108 | 000100010000100100 | 3 | 000010000010010000 | 3 | 001000000000010000 | 3 | 010010000000001000 | 3 |
| 109 | 000010010010010000 | 3 | 000010000000100100 | 3 | 000100000000001000 | 3 | 010000100000000100 | 3 |
| 110 | 000010000100100100 | 3 | 001000010000010000 | 3 | 000010000000000100 | 3 | 001001000000001000 | 3 |
| 111 | 000001000000010000 | 3 | 001000001000001000 | 3 | 010010010000001000 | 3 | 001000100000000100 | 3 |
| 112 | 000000100000001000 | 3 | 001000001000000100 | 3 | 010010001000000100 | 3 | 000100100000001000 | 3 |
| 113 | 000000010000000100 | 3 | 000100010001000100 | 3 | 010000101000010000 | 3 | 000100010000000100 | 3 |
| 114 | 001001010010010000 | 3 | 000100001000010000 | 3 | 010000100010000100 | 3 | 000010010010000100 | 3 |
| 115 | 001001000100010100 | 3 | 000010000010001000 | 3 | 010000010010001000 | 3 | 000010001000000100 | 3 |
| 116 | 001000100100001000 | 3 | 000010000100001000 | 3 | 010000100010001000 | 3 | 000001000100001000 | 3 |
| 117 | 001000100010000100 | 3 | 000010000001001000 | 3 | 010000010010010000 | 3 | 000000100010000100 | 3 |
| 118 | 001000010010001000 | 3 | 000010010100010000 | 3 | 010000001000000100 | 3 | 000000100010010000 | 3 |
| 119 | 001000010001000100 | 3 | 000010010100100100 | 3 | 001001000001000100 | 3 | 000000010001000100 | 3 |
| 120 | 000100100100000100 | 3 | 001001000000010000 | 3 | 001001001000000100 | 3 | 000000001001001000 | 3 |

FIG. 12C

| DATA SYMBOL | DCG11 Code Word MSB LSB | NCG | DCG12 Code Word MSB LSB | NCG | DCG21 Code Word MSB LSB | NCG | DCG22 Code Word MSB LSB | NCG |
|---|---|---|---|---|---|---|---|---|
| 121 | 00010001001000100 | 3 | 00100001000001000 | 3 | 00100001001000100 | 3 | 00000001000100100 | 3 |
| 122 | 00010000100100100 | 3 | 00100000100100100 | 3 | 00100000100100100 | 3 | 01001000000010000 | 3 |
| 123 | 00001000000010000 | 3 | 00010001000010000 | 3 | 00010000000010000 | 3 | 01000100000001000 | 3 |
| 124 | 00000100000001000 | 3 | 00010000100001000 | 3 | 00001000000001000 | 3 | 01000010000000100 | 3 |
| 125 | 00000010000000100 | 3 | 00010000010000100 | 3 | 00000100000000100 | 3 | 00100100000010000 | 3 |
| 126 | 00100000000100000 | 4 | 00000000001000000 | 4 | 00000000010010000 | 3 | 00100010000001000 | 3 |
| 127 | 00000100100000000 | 4 | 00000000010000000 | 4 | 00000000100010000 | 3 | 00100001000000100 | 3 |
| 128 | 00000010010000000 | 4 | 00100100010000000 | 4 | 00000000100001000 | 3 | 00010010000010000 | 3 |
| 129 | 00000001001000000 | 4 | 00100010010000000 | 4 | 00000001000010000 | 3 | 00010001000001000 | 3 |
| 130 | 00000000100100000 | 4 | 00100001001000000 | 4 | 00000000100001000 | 3 | 00010000100000100 | 3 |
| 131 | 00001000100000000 | 4 | 00100000100100000 | 4 | 00000000010000100 | 3 | 00001001000010000 | 3 |
| 132 | 00000100010000000 | 4 | 00100100010000000 | 4 | 01001000010010000 | 3 | 00001000100010000 | 3 |
| 133 | 00000010001000000 | 4 | 00100010001000000 | 4 | 01001000001001000 | 3 | 00001000010010000 | 3 |
| 134 | 00000001000100000 | 4 | 00100001000100000 | 4 | 01001000000100100 | 3 | 00000100100010000 | 3 |
| 135 | 00010000100000000 | 4 | 00010010010000000 | 4 | 00100100010010000 | 3 | 00000100010001000 | 3 |
| 136 | 00001000010000000 | 4 | 00010001001000000 | 4 | 00100100001001000 | 3 | 00000100001000100 | 3 |
| 137 | 00000100001000000 | 4 | 00010000100100000 | 4 | 00100100000100100 | 3 | 00000100010010000 | 3 |
| 138 | 00000010000100000 | 4 | 00100100001000000 | 4 | 00010010010010000 | 3 | 00000100001001000 | 3 |
| 139 | 00100100100100000 | 4 | 00100010000100000 | 4 | 00010010001001000 | 3 | 00000100000100100 | 3 |
| 140 | 00100000100000000 | 4 | 00010010001000000 | 4 | 00010010000100100 | 3 | 01000000010010000 | 3 |
| 141 | 00010000010000000 | 4 | 00010001000100000 | 4 | 00001001001001000 | 3 | 01000000001001000 | 3 |
| 142 | 00001000001000000 | 4 | 00001001001000000 | 4 | 00001001000100100 | 3 | 01000000000100100 | 3 |
| 143 | 00000100000100000 | 4 | 00001000100100000 | 4 | 00000100100100100 | 3 | 01000000100010000 | 3 |
| 144 | 00100000010000000 | 4 | 00100000100100000 | 4 | 00000010000010000 | 3 | 01000000010001000 | 3 |
| 145 | 00010000001000000 | 4 | 00010010000100000 | 4 | 00000001000001000 | 3 | 01000000001000100 | 3 |
| 146 | 00001000000100000 | 4 | 00001001000100000 | 4 | 00000000100000100 | 3 | 00100000010010000 | 3 |
| 147 | 00100000001000000 | 4 | 00000100100100000 | 4 | 01001000100010000 | 3 | 00100000001001000 | 3 |
| 148 | 00010000000100000 | 4 | 00000000100000000 | 4 | 01001000010001000 | 3 | 00100000000100100 | 3 |
| 149 | 01000000100010001 | 1 | 01001000100010001 | 1 | 01001000001000100 | 3 | 01000001000010000 | 3 |
| 150 | 01000000001001001 | 1 | 01001000001001001 | 1 | 01000100010010000 | 3 | 01000000100001000 | 3 |
| 151 | 01000000100010001 | 1 | 01001000100010001 | 1 | 01000100001001000 | 3 | 01000000010000100 | 3 |
| 152 | 01000000010001001 | 1 | 01001000010001001 | 1 | 01000100000100100 | 3 | 00100000100010000 | 3 |
| 153 | 01000001000010001 | 1 | 01000100100010001 | 1 | 00100100100010000 | 3 | 00100000010001000 | 3 |
| 154 | 01000000100001001 | 1 | 01000100001001001 | 1 | 00100100010001000 | 3 | 00100000001000100 | 3 |
| 155 | 01001001001001001 | 1 | 01000000000010001 | 1 | 00100100001000100 | 3 | 00010000010010000 | 3 |
| 156 | 01000010000010001 | 1 | 01001001000001001 | 1 | 00100010010010000 | 3 | 00010000001001000 | 3 |
| 157 | 01000001000001001 | 1 | 01000100100010001 | 1 | 00100010001001000 | 3 | 00010000000100100 | 3 |
| 158 | 01001000000001001 | 1 | 01000010010001001 | 1 | 00100010000100100 | 3 | 01001001001001000 | 3 |
| 159 | 01001000000010001 | 1 | 01000001001001001 | 1 | 00010010010001000 | 3 | 01001001000100100 | 3 |
| 160 | 01000100000001001 | 1 | 01001001000010001 | 1 | 00010010001000100 | 3 | 01000100100100100 | 3 |
| 161 | 01000100000010001 | 1 | 01001000100001001 | 1 | 00010010001001000 | 3 | 01000010000010000 | 3 |
| 162 | 01000010000001001 | 1 | 01001000100010001 | 1 | 00010010001000100 | 3 | 01000001000001000 | 3 |
| 163 | 01001001000000001 | 1 | 01000100000000001 | 1 | 00001001001000100 | 3 | 01000000100000100 | 3 |
| 164 | 01000100100000001 | 1 | 01000010000000001 | 1 | 00001000100100100 | 3 | 00100001000010000 | 3 |
| 165 | 01000010010000001 | 1 | 01001001001000001 | 1 | 00000100000010000 | 3 | 00100000100001000 | 3 |
| 166 | 01000001001000001 | 1 | 01001000100100001 | 1 | 00000010000001000 | 3 | 00100000010000100 | 3 |
| 167 | 01000000100100001 | 1 | 01000001001000001 | 1 | 00000001000000100 | 3 | 00010000100010000 | 3 |
| 168 | 01001000100000001 | 1 | 01001001000100001 | 1 | 01001001000010000 | 3 | 00010000010001000 | 3 |
| 169 | 01000100010000001 | 1 | 01000100100100001 | 1 | 01001000100001000 | 3 | 00010000001000100 | 3 |
| 170 | 01000010001000001 | 1 | 01000000100000001 | 1 | 01001000010000100 | 3 | 00001000100010000 | 3 |
| 171 | 01000001000100001 | 1 | 01000000000100001 | 1 | 01000100100010000 | 3 | 00001000010001000 | 3 |
| 172 | 01001000010000001 | 1 | 01000000000000001 | 1 | 01000100010001000 | 3 | 00001000010010000 | 3 |
| 173 | 01001000000100001 | 1 | 01000010000000001 | 1 | 01000100001000100 | 3 | 01001001001000100 | 3 |
| 174 | 01001001000000010 | 2 | 01001000000000010 | 2 | 01000010010010000 | 3 | 01001000100100100 | 3 |
| 175 | 01000100100000010 | 2 | 01000100000000010 | 2 | 01000010001001000 | 3 | 01000100000010000 | 3 |
| 176 | 01000010010000010 | 2 | 01000010000000010 | 2 | 01000010000100100 | 3 | 01000010000001000 | 3 |
| 177 | 01000001001000010 | 2 | 01001001001000010 | 2 | 00100100100010000 | 3 | 01000001000000100 | 3 |
| 178 | 01000000100100010 | 2 | 01001000100100010 | 2 | 00100100010000100 | 3 | 00100100100100100 | 3 |
| 179 | 01000000010010010 | 2 | 01001000010010010 | 2 | 00010010010001000 | 3 | 00100010000010000 | 3 |
| 180 | 01001000100000010 | 2 | 01000001000000010 | 2 | 00100010001000100 | 3 | 00100001000001000 | 3 |

FIG. 12D

| DATA SYMBOL | DCG11 Code Word MSB LSB | NCG | DCG12 Code Word MSB LSB | NCG | DCG21 Code Word MSB LSB | NCG | DCG22 Code Word MSB LSB | NCG |
|---|---|---|---|---|---|---|---|---|
| 181 | 0100010001000010 | 2 | 0100000000010010 | 2 | 0010000100100100 | 3 | 0010000010000100 | 3 |
| 182 | 0100001000100010 | 2 | 0100000000100010 | 2 | 0010000100010000 | 3 | 0001000100001000 | 3 |
| 183 | 0100000100010010 | 2 | 0100000001000010 | 2 | 0001001001000100 | 3 | 0010000100001000 | 3 |
| 184 | 0100000010001001 | 2 | 0100100100001010 | 2 | 0001000100100100 | 3 | 0001000100010000 | 3 |
| 185 | 0100100001000010 | 2 | 0100010010001010 | 2 | 0001000010010000 | 3 | 0001000100010000 | 3 |
| 186 | 0100010000100010 | 2 | 0100010001001010 | 2 | 0000100000010000 | 3 | 0001000100001000 | 3 |
| 187 | 0100100000010010 | 2 | 0100000010000010 | 2 | 0000010000001000 | 3 | 0000100010001000 | 3 |
| 188 | 0100100000100010 | 2 | 0101001000100010 | 2 | 0000001000001000 | 3 | 0000100010010000 | 3 |
| 189 | 0100100001001010 | 2 | 0100100100010010 | 2 | 0100000000100000 | 4 | 0100010010000000 | 4 |
| 190 | 0100100001000010 | 2 | 0100010010100010 | 2 | 0100000001000000 | 4 | 0100001001000000 | 4 |
| 191 | 0100010000100010 | 2 | 0100010001001010 | 2 | 0010000000100000 | 4 | 0100000100100000 | 4 |
| 192 | 0100001000010010 | 2 | 0100000010100010 | 2 | 0000010000000000 | 4 | 0100010010000000 | 4 |
| 193 | 0100000000010100 | 3 | 0101000000000100 | 3 | 0000010010100000 | 4 | 0100010010000000 | 4 |
| 194 | 0100100100000100 | 3 | 0100100000001000 | 3 | 0000000100100000 | 4 | 0100001000100000 | 4 |
| 195 | 0100010010000100 | 3 | 0100010000000100 | 3 | 0000100001000000 | 4 | 0010010010000000 | 4 |
| 196 | 0100001001000100 | 3 | 0101000000010000 | 3 | 0000100100100000 | 4 | 0010010010000000 | 4 |
| 197 | 0100000100100100 | 3 | 0100100000100100 | 3 | 0000001001000000 | 4 | 0010000100100000 | 4 |
| 198 | 0100000100101000 | 3 | 0100001000001100 | 3 | 0000100001000000 | 4 | 0100100010000000 | 4 |
| 199 | 0100100100001000 | 3 | 0100000000010000 | 3 | 0000010001000000 | 4 | 0100010001000000 | 4 |
| 200 | 0100100100000100 | 3 | 0100000001001000 | 3 | 0000010010100000 | 4 | 0100010010000000 | 4 |
| 201 | 0100100010010000 | 3 | 0100000000010100 | 3 | 0100100010100000 | 4 | 0010010010000000 | 4 |
| 202 | 0100100001001000 | 3 | 0100000010010000 | 3 | 0100100010100000 | 4 | 0010010010000000 | 4 |
| 203 | 0100100000100100 | 3 | 0100000010001000 | 3 | 0010010010000000 | 4 | 0010000100010000 | 4 |
| 204 | 0100100010010000 | 3 | 0100000010001000 | 3 | 0001000010000000 | 4 | 0001001001000000 | 4 |
| 205 | 0100100001001000 | 3 | 0100001000010000 | 3 | 0000100010100000 | 4 | 0001000100100000 | 4 |
| 206 | 0100100000100000 | 3 | 0100001000010000 | 3 | 0100100010100000 | 4 | 0100010010000000 | 4 |
| 207 | 0100001000100000 | 3 | 0100000010000100 | 3 | 0100100010000000 | 4 | 0100010001000000 | 4 |
| 208 | 0100010000100100 | 3 | 0100100100100100 | 3 | 0100010010000000 | 4 | 0100010001000000 | 4 |
| 209 | 0100001000100100 | 3 | 0100100100010000 | 3 | 0001000010000000 | 4 | 0010010010000000 | 4 |
| 210 | 0100100100000000 | 3 | 0100001001010000 | 3 | 0001000100100000 | 4 | 0010001010010000 | 4 |
| 211 | 0101100100001000 | 3 | 0100001000010000 | 3 | 0000100010010000 | 4 | 0001100010010000 | 4 |
| 212 | 0100100000100100 | 3 | 0100001000010000 | 3 | 0100000010000000 | 4 | 0010001010010000 | 4 |
| 213 | 0100010010010000 | 3 | 0100000010001100 | 3 | 0010000001000000 | 4 | 0001001001010000 | 4 |
| 214 | 0100010001001000 | 3 | 0100100100100100 | 3 | 0001000010000000 | 4 | 0001000010100000 | 4 |
| 215 | 0100100001000100 | 3 | 0101001000100100 | 3 | 0100000010010001 | 1 | 0100000000010001 | 1 |
| 216 | 0100010010010000 | 3 | 0100100000010000 | 3 | 0100000001001001 | 1 | 0010000000001001 | 1 |
| 217 | 0100001000001000 | 3 | 0100001000001000 | 3 | 0100000010010001 | 1 | 0010000000010001 | 1 |
| 218 | 0100001000100100 | 3 | 0100001001000100 | 3 | 0100000001001001 | 1 | 0001000000010001 | 1 |
| 219 | 0100000000001000 | 4 | 0100001001000000 | 4 | 0010000010010001 | 1 | 0100100100001001 | 1 |
| 220 | 0100000001000000 | 4 | 0100001001000000 | 4 | 0010000010010001 | 1 | 0100010010001001 | 1 |
| 221 | 0100010001000000 | 4 | 0100000100100000 | 4 | 0100001000010001 | 1 | 0100001001001001 | 1 |
| 222 | 0100100010010000 | 4 | 0100000010010000 | 4 | 0100000100010001 | 1 | 0100001001001001 | 1 |
| 223 | 0100100100100000 | 4 | 0100100100100000 | 4 | 0010001001000001 | 1 | 0001000010010001 | 1 |
| 224 | 0100010001000000 | 4 | 0100100010010000 | 4 | 0010000001001001 | 1 | 0001000010010001 | 1 |
| 225 | 0100001000100000 | 4 | 0100100010100000 | 4 | 0001000010010001 | 1 | 0100100100010001 | 1 |
| 226 | 0100000010000000 | 4 | 0100000100100100 | 4 | 0001000010010001 | 1 | 0100100010010001 | 1 |
| 227 | 0010000010010001 | 1 | 0000000100100001 | 1 | 0100100100010001 | 1 | 0100100100010001 | 1 |
| 228 | 0010000001001001 | 1 | 0000000010010001 | 1 | 0100010001001001 | 1 | 0100010001001001 | 1 |
| 229 | 0010000100010001 | 1 | 0000000100010001 | 1 | 0100010001001001 | 1 | 0100001001010001 | 1 |
| 230 | 0010000010001001 | 1 | 0000000010001001 | 1 | 0010001001001001 | 1 | 0100001001001001 | 1 |
| 231 | 0001000010010001 | 1 | 0000000100010001 | 1 | 0010000100001001 | 1 | 0010010010001001 | 1 |
| 232 | 0001000010010001 | 1 | 0000000100010001 | 1 | 0001000010010001 | 1 | 0010010010010001 | 1 |
| 233 | 0010000010010001 | 1 | 0010010010010001 | 1 | 0001000010010001 | 1 | 0010100100100001 | 1 |
| 234 | 0010000010001001 | 1 | 0010010010010001 | 1 | 0000100010010001 | 1 | 0000100000010001 | 1 |
| 235 | 0001000010010001 | 1 | 0001001010010001 | 1 | 0000100010010001 | 1 | 0000010000001001 | 1 |
| 236 | 0001000100010001 | 1 | 0001001001010001 | 1 | 0100100010001001 | 1 | 0000100010010001 | 1 |
| 237 | 0000100010010001 | 1 | 0010010010010001 | 1 | 0010010001001001 | 1 | 0000000100010001 | 1 |
| 238 | 0000100010010001 | 1 | 0000010010010001 | 1 | 0010010010001001 | 1 | 0000001000010001 | 1 |
| 239 | 0010010000010001 | 1 | 0000010010010001 | 1 | 0000100100010001 | 1 | 0000000100010001 | 1 |
| 240 | 0001001000001001 | 1 | 0010010010010001 | 1 | 0000010000001001 | 1 | 0000000100001001 | 1 |

FIG. 12E

| DATA SYMBOL | DCG11 Code Word MSB LSB | NCG | DCG12 Code Word MSB LSB | NCG | DCG21 Code Word MSB LSB | NCG | DCG22 Code Word MSB LSB | NCG |
|---|---|---|---|---|---|---|---|---|
| 241 | 0000100100001001 | 1 | 0010010001001001 | 1 | 0000001001001001 | 1 | 0100100010010001 | 1 |
| 242 | 0000010010001001 | 1 | 0010001001001001 | 1 | 0000000100101001 | 1 | 0100100001001001 | 1 |
| 243 | 0001000010001001 | 1 | 0010001001001001 | 1 | 0100100000010001 | 1 | 0010010001001001 | 1 |
| 244 | 0000100010010001 | 1 | 0010010010001001 | 1 | 0100010000001001 | 1 | 0010010000101001 | 1 |
| 245 | 0000100001001001 | 1 | 0010001001001001 | 1 | 0010010000010001 | 1 | 0001001001001001 | 1 |
| 246 | 0000010001001001 | 1 | 0000010000001001 | 1 | 0010010000001001 | 1 | 0001001000101001 | 1 |
| 247 | 0000010001001001 | 1 | 0000001000001001 | 1 | 0001001000010001 | 1 | 0000100010010001 | 1 |
| 248 | 0001000100001001 | 1 | 0010000001001001 | 1 | 0001000100001001 | 1 | 0000010000010001 | 1 |
| 249 | 0000100100010001 | 1 | 0010000001001001 | 1 | 0000100100010001 | 1 | 0000001000001001 | 1 |
| 250 | 0000100100001001 | 1 | 0001000000001001 | 1 | 0000100010001001 | 1 | 0100100010010001 | 1 |
| 251 | 0000010010010001 | 1 | 0010000000010001 | 1 | 0000010010010001 | 1 | 0101001000010001 | 1 |
| 252 | 0000010010001001 | 1 | 0010001000001001 | 1 | 0000010000101001 | 1 | 0100010010010001 | 1 |
| 253 | 0000100101001001 | 1 | 0010010010001001 | 1 | 0000001001001001 | 1 | 0100100001001001 | 1 |
| 254 | 0000010001001001 | 1 | 0010001001001001 | 1 | 0000001001001001 | 1 | 0010010010010001 | 1 |
| 255 | 0010001000010001 | 1 | 0010001001001001 | 1 | 0100010000010001 | 1 | 0010010010001001 | 1 |

FIG. 12F

| DATA SYMBOL | DCG31 Code Word MSB LSB | NCG | DCG32 Code Word MSB LSB | NCG | DCG41 Code Word MSB LSB | NCG | DCG42 Code Word MSB LSB | NCG |
|---|---|---|---|---|---|---|---|---|
| 000 | 100100100000000001 | 1 | 001001000000000001 | 1 | 100100100000000001 | 1 | 001001000000000001 | 1 |
| 001 | 100010010000000001 | 1 | 000100100000000001 | 1 | 100010010000000001 | 1 | 010001000000000001 | 1 |
| 002 | 100001001000000001 | 1 | 000010010000000001 | 1 | 100001001000000001 | 1 | 001000100000000001 | 1 |
| 003 | 100000100100000001 | 1 | 000001001000000001 | 1 | 100000100100000001 | 1 | 100001000000000001 | 1 |
| 004 | 100000010010000001 | 1 | 000000100100000001 | 1 | 100000010010000001 | 1 | 010000100000000001 | 1 |
| 005 | 100000001001000001 | 1 | 001000100000000001 | 1 | 100000001001000001 | 1 | 001000010000000001 | 1 |
| 006 | 100100010000000001 | 1 | 000100010000000001 | 1 | 100100010000000001 | 1 | 100100100010000001 | 1 |
| 007 | 100010001000000001 | 1 | 000010001000000001 | 1 | 100010001000000001 | 1 | 100100010010000001 | 1 |
| 008 | 100001000100000001 | 1 | 000001000100000001 | 1 | 100001000100000001 | 1 | 100100000100000001 | 1 |
| 009 | 100000100010000001 | 1 | 000000100010000001 | 1 | 100000100010000001 | 1 | 100000100000000001 | 1 |
| 010 | 100000010001000001 | 1 | 100001000000000001 | 1 | 100000010001000001 | 1 | 010010010010000001 | 1 |
| 011 | 100100001000000001 | 1 | 001000010000000001 | 1 | 010010010000000001 | 1 | 010010000100000001 | 1 |
| 012 | 100010000100000001 | 1 | 000100001000000001 | 1 | 010001001000000001 | 1 | 010000100000000001 | 1 |
| 013 | 100001000010000001 | 1 | 000010000100000001 | 1 | 010000100100000001 | 1 | 001001000100000001 | 1 |
| 014 | 100000100001000001 | 1 | 000001000010000001 | 1 | 010000010010000001 | 1 | 001000001000000001 | 1 |
| 015 | 001001001000000001 | 1 | 000000100001000001 | 1 | 010000001001000001 | 1 | 100100010010000001 | 1 |
| 016 | 001001010000000001 | 1 | 100100100000000001 | 1 | 100100001000000001 | 1 | 100100100100000001 | 1 |
| 017 | 001000010010000001 | 1 | 100100010000000001 | 1 | 100010000100000001 | 1 | 100010010010000001 | 1 |
| 018 | 001000000100000001 | 1 | 100100000100000001 | 1 | 100001000010000001 | 1 | 100000100100000001 | 1 |
| 019 | 000000100000000001 | 1 | 100000100000000001 | 1 | 100000100001000001 | 1 | 100000010000000001 | 1 |
| 020 | 001000010000000001 | 1 | 001001001000000001 | 1 | 010010010000000001 | 1 | 010010010000000001 | 1 |
| 021 | 100010000010000001 | 1 | 001000000100000001 | 1 | 010001000100000001 | 1 | 010001000100000001 | 1 |
| 022 | 100000100000100001 | 1 | 000100000100000001 | 1 | 010000100100000001 | 1 | 010000100100000001 | 1 |
| 023 | 001001000100000001 | 1 | 000001000000100001 | 1 | 010000100000000001 | 1 | 100000000010000001 | 1 |
| 024 | 001000100010000001 | 1 | 000000100000100001 | 1 | 001001000100000001 | 1 | 100000000100000001 | 1 |
| 025 | 001000010001000001 | 1 | 100100100010000001 | 1 | 001000100010000001 | 1 | 100000000010000001 | 1 |
| 026 | 000100100010000001 | 1 | 100100010000100001 | 1 | 001001000100000001 | 1 | 010000000100000001 | 1 |
| 027 | 000100010010000001 | 1 | 100010010001000001 | 1 | 001000010010000001 | 1 | 100000001000000001 | 1 |
| 028 | 000100000100000001 | 1 | 100010001000000001 | 1 | 100100001000000001 | 1 | 010000001000000001 | 1 |
| 029 | 000000100000100001 | 1 | 100001000000100001 | 1 | 100010000100000001 | 1 | 001000000010000001 | 1 |
| 030 | 100100000100000001 | 1 | 001000010000100001 | 1 | 100001000010000001 | 1 | 100100100000100001 | 1 |
| 031 | 100010000010000001 | 1 | 000100000100000001 | 1 | 010010000100000001 | 1 | 100010010000100001 | 1 |
| 032 | 001001000001000001 | 1 | 000001000001000001 | 1 | 010001000010000001 | 1 | 100001000100100001 | 1 |
| 033 | 001000100000100001 | 1 | 100000000001000001 | 1 | 100100000100000001 | 1 | 100000010001000001 | 1 |
| 034 | 000100100001000001 | 1 | 100000001000000001 | 1 | 010010000100000001 | 1 | 010000000100000001 | 1 |
| 035 | 000100010001000001 | 1 | 100000000000100001 | 1 | 001001000000100001 | 1 | 001000001000000001 | 1 |
| 036 | 000010010001000001 | 1 | 001000000000100001 | 1 | 100100100000000010 | 2 | 010010000000000010 | 2 |
| 037 | 000010001000100001 | 1 | 100100000000100001 | 1 | 100010010000000010 | 2 | 001000100000000010 | 2 |
| 038 | 100100000000100001 | 1 | 100010010000100001 | 1 | 100001001000000010 | 2 | 100010000000000010 | 2 |
| 039 | 001001000000100001 | 1 | 100000100100000001 | 1 | 100000100100000010 | 2 | 010001000000000010 | 2 |
| 040 | 000100100000100001 | 1 | 100000010000000001 | 1 | 100000010010000010 | 2 | 001000100000000010 | 2 |
| 041 | 000100010001000001 | 1 | 100001000000000001 | 1 | 100000001001000010 | 2 | 100010000000000010 | 2 |
| 042 | 000001001000100001 | 1 | 000100000000100001 | 1 | 100000000100100010 | 2 | 010000100000000010 | 2 |
| 043 | 100100100000000010 | 2 | 001001000000000010 | 2 | 100100010000000010 | 2 | 001000010000000010 | 2 |
| 044 | 100010010000000010 | 2 | 000100100000000010 | 2 | 100010001000000010 | 2 | 100100100100000010 | 2 |
| 045 | 100001001000000010 | 2 | 000010010000000010 | 2 | 100001000100000010 | 2 | 100100100010000010 | 2 |
| 046 | 100000100100000010 | 2 | 000001001000000010 | 2 | 100000100010000010 | 2 | 100100000100000010 | 2 |
| 047 | 100000010010000010 | 2 | 000000100100000010 | 2 | 100000010001000010 | 2 | 100100000010000010 | 2 |
| 048 | 100000001001000010 | 2 | 100010000000000010 | 2 | 100000001000100010 | 2 | 100000010000000010 | 2 |
| 049 | 100000000010010010 | 2 | 001001000000000010 | 2 | 010010010000000010 | 2 | 010010010010000010 | 2 |
| 050 | 100100010000000010 | 2 | 000100010000000010 | 2 | 010001001000000010 | 2 | 010010000100000010 | 2 |
| 051 | 100010001000000010 | 2 | 000010001000000010 | 2 | 010000100100000010 | 2 | 010001000010000010 | 2 |
| 052 | 100001000100000010 | 2 | 000001000100000010 | 2 | 010000010010000010 | 2 | 010000000100000010 | 2 |
| 053 | 100000100001000010 | 2 | 000000100010000010 | 2 | 010000001000100010 | 2 | 001001000100000010 | 2 |
| 054 | 100000100001000010 | 2 | 100001000000000010 | 2 | 010000000100010010 | 2 | 001000100010000010 | 2 |
| 055 | 100000000100010010 | 2 | 001000010000000010 | 2 | 100100000100000010 | 2 | 001000100000000010 | 2 |
| 056 | 000010000000000010 | 2 | 000100010000000010 | 2 | 100010000100000010 | 2 | 100000000100000010 | 2 |
| 057 | 100100000100000010 | 2 | 000010010000000010 | 2 | 100001000100000010 | 2 | 010000000100000010 | 2 |
| 058 | 100010000010000010 | 2 | 000001000001000010 | 2 | 100000100001000010 | 2 | 100000000010000010 | 2 |
| 059 | 100001000001000010 | 2 | 000000100001000010 | 2 | 100000001000010010 | 2 | 010000000100000010 | 2 |
| 060 | 100000100000100010 | 2 | 001001001000000010 | 2 | 010010001000000010 | 2 | 001000000000100010 | 2 |

FIG. 12G

| DATA SYMBOL | DCG31 Code Word MSB LSB | NCG | DCG32 Code Word MSB LSB | NCG | DCG41 Code Word MSB LSB | NCG | DCG42 Code Word MSB LSB | NCG |
|---|---|---|---|---|---|---|---|---|
| 061 | 1000000100001010 | 2 | 1001000100100010 | 2 | 0100010001000010 | 2 | 1001001000010010 | 2 |
| 062 | 0010010010000010 | 2 | 1001000010010010 | 2 | 0100010001000010 | 2 | 1000100100010010 | 2 |
| 063 | 0010001001000010 | 2 | 1001000001001000 | 2 | 0100001000100010 | 2 | 1000100100010010 | 2 |
| 064 | 0010000100100010 | 2 | 1000001000000010 | 2 | 0100000100010010 | 2 | 1000010010010010 | 2 |
| 065 | 0010000010010010 | 2 | 0010010010010010 | 2 | 0010010010000010 | 2 | 1000000010000010 | 2 |
| 066 | 0010000001001010 | 2 | 0010010001001001 | 2 | 0010000101000010 | 2 | 0100000001000010 | 2 |
| 067 | 0000010000010010 | 2 | 0010001000100010 | 2 | 0010000100100010 | 2 | 0010000100100010 | 2 |
| 068 | 1001001010010010 | 2 | 0001010010100010 | 2 | 0010000010000010 | 2 | 1001001000100010 | 2 |
| 069 | 1001000100001010 | 2 | 0001010000010010 | 2 | 0010000010010010 | 2 | 1001001000010010 | 2 |
| 070 | 1000100010000010 | 2 | 0000100001010010 | 2 | 1001001001001010 | 2 | 1000100100010010 | 2 |
| 071 | 1000010000100010 | 2 | 0000010000100010 | 2 | 1001000001000010 | 2 | 1000100010010010 | 2 |
| 072 | 1000000100000010 | 2 | 0000001000100010 | 2 | 1000010001000010 | 2 | 1000010010010010 | 2 |
| 073 | 0010010001000010 | 2 | 1000100000100010 | 2 | 1000001000000010 | 2 | 1000010010010010 | 2 |
| 074 | 0010001001000010 | 2 | 1000000001000010 | 2 | 1000000100010010 | 2 | 1000000010000010 | 2 |
| 075 | 0010000100100010 | 2 | 0010000000010010 | 2 | 0100100001000010 | 2 | 0100100100010010 | 2 |
| 076 | 0010000001000010 | 2 | 1001001000001001 | 2 | 0100010000100010 | 2 | 0100010010010010 | 2 |
| 077 | 0001001001000010 | 2 | 1000100100001001 | 2 | 1001000000001001 | 2 | 0100001001010010 | 2 |
| 078 | 0001000010000010 | 2 | 1000010010001001 | 2 | 0100100000010010 | 2 | 0100000010000010 | 2 |
| 079 | 0000010010000010 | 2 | 1000010001010001 | 2 | 0010010000001001 | 2 | 0010000001000010 | 2 |
| 080 | 0000010001001001 | 2 | 1000001000010001 | 2 | 1001000010010010 | 2 | 1001001010010001 | 2 |
| 081 | 0000010001001001 | 2 | 0010000000100001 | 2 | 1001000000010001 | 2 | 1001000100100010 | 2 |
| 082 | 1001000000010001 | 2 | 0001000000010001 | 2 | 0100100000100010 | 2 | 1001000010010001 | 2 |
| 083 | 0010010000001001 | 2 | 1001000100001001 | 2 | 0100100000010001 | 2 | 1000100100100001 | 2 |
| 084 | 0001001000001001 | 2 | 1000010010001001 | 2 | 0100001000000001 | 2 | 1000100100010001 | 2 |
| 085 | 0001001001001001 | 2 | 1000010001001001 | 2 | 0010010000010001 | 2 | 1000100010010001 | 2 |
| 086 | 0000010010001001 | 2 | 1000001001001001 | 2 | 1001000001000010 | 2 | 1000000100000001 | 2 |
| 087 | 0000001001001001 | 2 | 1000001001001001 | 2 | 1000100000001001 | 2 | 0100100100100010 | 2 |
| 088 | 1001000000000001 | 2 | 1000000100010001 | 2 | 1000010000001001 | 2 | 0100100100010001 | 2 |
| 089 | 1000100000010001 | 2 | 1000001000000001 | 2 | 0100100000010001 | 2 | 0100010010010001 | 2 |
| 090 | 0010010000001001 | 2 | 0010000010001001 | 2 | 0100010000001001 | 2 | 0100010001010010 | 2 |
| 091 | 0010010000001001 | 2 | 0001001000000001 | 2 | 0100001000100010 | 2 | 0100000010000010 | 2 |
| 092 | 0001001010001001 | 2 | 0000100000001001 | 2 | 0010010001000010 | 2 | 0010010010001001 | 2 |
| 093 | 0001001010001001 | 2 | 1001001001000010 | 2 | 0010001000010001 | 2 | 0010010010010001 | 2 |
| 094 | 0000100101000001 | 2 | 1001001001001001 | 2 | 0010010000010010 | 2 | 0010000001000010 | 2 |
| 095 | 0000010010001001 | 2 | 1001000010000010 | 2 | 1001001000000100 | 3 | 1001000000000100 | 3 |
| 096 | 0000010010001001 | 2 | 1001000010010010 | 2 | 1001001000000100 | 3 | 0100100000000100 | 3 |
| 097 | 0000010001001010 | 2 | 1000100010010010 | 2 | 1000001001000010 | 3 | 0010001000010100 | 3 |
| 098 | 1001000001010010 | 2 | 1000100010010010 | 2 | 1000010001000100 | 3 | 1000100000000100 | 3 |
| 099 | 1000100000001001 | 2 | 1000000100000010 | 2 | 1000000101010010 | 3 | 1000100000000100 | 3 |
| 100 | 1000010000000010 | 2 | 0010010010010010 | 2 | 1000000010010100 | 3 | 0100100000001000 | 3 |
| 101 | 0010010001001001 | 2 | 0010001010010010 | 2 | 0100000000010000 | 3 | 0100010000000100 | 3 |
| 102 | 0010001000000010 | 2 | 0010000100000010 | 2 | 0010000000010001 | 3 | 0010010000001000 | 3 |
| 103 | 0010000101000001 | 2 | 0001000001000010 | 2 | 1001001000001000 | 3 | 0010001000000100 | 3 |
| 104 | 0001001001001001 | 2 | 0000100000100010 | 2 | 1001000100000100 | 3 | 1001000001010000 | 3 |
| 105 | 0001001001001010 | 2 | 0000010010001010 | 2 | 1001001000000100 | 3 | 1000100001000100 | 3 |
| 106 | 1001001000000100 | 3 | 1001000000000100 | 3 | 1001001000000100 | 3 | 1000100001000100 | 3 |
| 107 | 1000010001001000 | 3 | 0010010000000100 | 3 | 1000010001001000 | 3 | 0100100010000100 | 3 |
| 108 | 1000010010000100 | 3 | 0001001000000100 | 3 | 1000010001001000 | 3 | 0100100010000100 | 3 |
| 109 | 1000000010010000 | 3 | 0000100100000100 | 3 | 1000000100100100 | 3 | 0100000100000100 | 3 |
| 110 | 1000000101000100 | 3 | 0000001001000000 | 3 | 1000000100100100 | 3 | 0010010000010000 | 3 |
| 111 | 1000000010010000 | 3 | 0000001001000000 | 3 | 1000001001001000 | 3 | 0010010000010000 | 3 |
| 112 | 0010000000001000 | 3 | 1001000000001000 | 3 | 1000001001001000 | 3 | 0010001000000100 | 3 |
| 113 | 0001000000000100 | 3 | 1000100000000100 | 3 | 0100100100001000 | 3 | 1000000001001000 | 3 |
| 114 | 1001001000001000 | 3 | 0010010000001000 | 3 | 0100010001000100 | 3 | 1000000000001000 | 3 |
| 115 | 1001000100000100 | 3 | 0010001001000100 | 3 | 0100001000100100 | 3 | 1000000000100100 | 3 |
| 116 | 1001000100001000 | 3 | 0001001000000100 | 3 | 0100001001000100 | 3 | 1000000100010000 | 3 |
| 117 | 1001000100100000 | 3 | 0001001000001000 | 3 | 0100001001001000 | 3 | 1000000000010000 | 3 |
| 118 | 1000010010001000 | 3 | 0000100100000001 | 3 | 0010000000001001 | 3 | 1000000001000100 | 3 |
| 119 | 1000010010001000 | 3 | 0000010010000100 | 3 | 1001001000000010 | 3 | 0100000000010000 | 3 |
| 120 | 1000000100100100 | 3 | 0000010010000100 | 3 | 1001001000001000 | 3 | 0100000000100000 | 3 |

FIG. 12H

| DATA SYMBOL | DCG31 Code Word MSB LSB | NCG | DCG32 Code Word MSB LSB | NCG | DCG41 Code Word MSB LSB | NCG | DCG42 Code Word MSB LSB | NCG |
|---|---|---|---|---|---|---|---|---|
| 121 | 10000010001000100 | 3 | 00000100010000100 | 3 | 10010000100000100 | 3 | 01000000000100100 | 3 |
| 122 | 10000010001001000 | 3 | 00000010010001000 | 3 | 10001001000010000 | 3 | 10000001000010000 | 3 |
| 123 | 10000001000100100 | 3 | 00000010001000100 | 3 | 10001000100001000 | 3 | 10000000100001000 | 3 |
| 124 | 00100000000010000 | 3 | 10010000000100000 | 3 | 10001000010000000 | 3 | 10000000010000100 | 3 |
| 125 | 00010000000001000 | 3 | 10001000000010000 | 3 | 10000100100010000 | 3 | 01000000100010000 | 3 |
| 126 | 00001000000000100 | 3 | 10000100000000100 | 3 | 10000100010001000 | 3 | 01000000010001000 | 3 |
| 127 | 10010010000010000 | 3 | 00100100000010000 | 3 | 10000100001000100 | 3 | 01000000001000100 | 3 |
| 128 | 10010001000001000 | 3 | 00100010000001000 | 3 | 10000010010010000 | 3 | 00100000010010000 | 3 |
| 129 | 10010000100000100 | 3 | 00100001000000100 | 3 | 10000010001001000 | 3 | 00100000001001000 | 3 |
| 130 | 10001001000010000 | 3 | 00010010000010000 | 3 | 10000010000100100 | 3 | 00100000000100100 | 3 |
| 131 | 10001000100001000 | 3 | 00010001000001000 | 3 | 01001001000001000 | 3 | 10010010010010000 | 3 |
| 132 | 10001000010000100 | 3 | 00010000100000100 | 3 | 01001000100000100 | 3 | 10010010001001000 | 3 |
| 133 | 10000100100010000 | 3 | 00001001000010000 | 3 | 01000100001000100 | 3 | 10010010000100100 | 3 |
| 134 | 10000100010001000 | 3 | 00001000100001000 | 3 | 01000100010010000 | 3 | 10010010001001000 | 3 |
| 135 | 10000100001000100 | 3 | 00001000010000100 | 3 | 01000010001001000 | 3 | 10010001000100100 | 3 |
| 136 | 10000010010010000 | 3 | 00000100100010000 | 3 | 01000010000100100 | 3 | 10000100100100100 | 3 |
| 137 | 10000010001001000 | 3 | 00000100010001000 | 3 | 00100100100001000 | 3 | 10000010000010000 | 3 |
| 138 | 10000010000100100 | 3 | 00000100001000100 | 3 | 00100100010000100 | 3 | 10000001000001000 | 3 |
| 139 | 00100100100000100 | 3 | 00000010010010000 | 3 | 00100010010001000 | 3 | 10000000100000100 | 3 |
| 140 | 00100010010000100 | 3 | 00000010001001000 | 3 | 00100010001000100 | 3 | 01000001000010000 | 3 |
| 141 | 00100001001000100 | 3 | 00000010000100100 | 3 | 00100001001001000 | 3 | 01000000100001000 | 3 |
| 142 | 00100000100100100 | 3 | 10000000010010000 | 3 | 00100001000100100 | 3 | 01000000010000100 | 3 |
| 143 | 00010000000010000 | 3 | 10000000001001000 | 3 | 10010000010010000 | 3 | 00100000100010000 | 3 |
| 144 | 00001000000001000 | 3 | 10000000000100100 | 3 | 10010000001001000 | 3 | 00100000010001000 | 3 |
| 145 | 00000100000000100 | 3 | 10000000100010000 | 3 | 10010000000100100 | 3 | 00100000001000100 | 3 |
| 146 | 10010000010010000 | 3 | 10000000010001000 | 3 | 01001000010010000 | 3 | 10010010010001000 | 3 |
| 147 | 10010000001001000 | 3 | 10000000001000100 | 3 | 01001000001001000 | 3 | 10010010001000100 | 3 |
| 148 | 10010000000100100 | 3 | 10000001000010000 | 3 | 01001000000100100 | 3 | 10010001001001000 | 3 |
| 149 | 00100100010010000 | 3 | 10000000100001000 | 3 | 00100100010010000 | 3 | 10010001000100100 | 3 |
| 150 | 00100100001001000 | 3 | 10000000010000100 | 3 | 00100100001001000 | 3 | 10001001001000100 | 3 |
| 151 | 00100100000100100 | 3 | 00100000010010000 | 3 | 00100100000100100 | 3 | 10001000100100100 | 3 |
| 152 | 00010010010010000 | 3 | 00100000001001000 | 3 | 10010000100010000 | 3 | 10000100000010000 | 3 |
| 153 | 00010010001001000 | 3 | 00100000000100100 | 3 | 10010000010001000 | 3 | 10000010000001000 | 3 |
| 154 | 00010010000100100 | 3 | 10010010010010000 | 3 | 10010000001000100 | 3 | 10000001000000100 | 3 |
| 155 | 00001001001001000 | 3 | 10010010001001000 | 3 | 10010000100010000 | 3 | 01001001001001000 | 3 |
| 156 | 00001001000100100 | 3 | 10010010000100100 | 3 | 10010000010001000 | 3 | 01001001000100100 | 3 |
| 157 | 00000100100100100 | 3 | 10010001001001000 | 3 | 10010000000100100 | 3 | 01000100100100100 | 3 |
| 158 | 00000010000010000 | 3 | 10010001000100100 | 3 | 01001000100010000 | 3 | 01000010000010000 | 3 |
| 159 | 10010000100010000 | 3 | 10001001000100100 | 3 | 01001000010001000 | 3 | 01000001000001000 | 3 |
| 160 | 10010000010001000 | 3 | 10000100000010000 | 3 | 01000100100010000 | 3 | 01000000100000100 | 3 |
| 161 | 10010000001000100 | 3 | 10000010000001000 | 3 | 01000100001001000 | 3 | 00100000100001000 | 3 |
| 162 | 10001000100010000 | 3 | 10000001000000100 | 3 | 01000100000100100 | 3 | 00100000100001000 | 3 |
| 163 | 10001000001001000 | 3 | 00100000100010000 | 3 | 01000100000100100 | 3 | 00100000010000100 | 3 |
| 164 | 10001000000100100 | 3 | 00100000010001000 | 3 | 00100100100010000 | 3 | 10010010010000100 | 3 |
| 165 | 00100100100010000 | 3 | 00100000001000100 | 3 | 00100100010001000 | 3 | 10010001001000100 | 3 |
| 166 | 00100100010001000 | 3 | 00010000100010000 | 3 | 00100100001000100 | 3 | 10010000100100100 | 3 |
| 167 | 00100100001000100 | 3 | 00010000010001000 | 3 | 00100010010010000 | 3 | 10001000000010000 | 3 |
| 168 | 00100010010010000 | 3 | 00010000000100100 | 3 | 00100010001001000 | 3 | 10000100000001000 | 3 |
| 169 | 00100010001001000 | 3 | 10010010010001000 | 3 | 00100010000100100 | 3 | 10000010000000100 | 3 |
| 170 | 00100010000100100 | 3 | 10010010001000100 | 3 | 10010010000010000 | 3 | 01001001001000100 | 3 |
| 171 | 00010010010001000 | 3 | 10010010001001000 | 3 | 10010001000100000 | 3 | 01001000100100100 | 3 |
| 172 | 00010010001000100 | 3 | 10010001000100100 | 3 | 10010001000100000 | 3 | 01000100000010000 | 3 |
| 173 | 00010001001001000 | 3 | 10010001001001000 | 3 | 10010001000100000 | 3 | 01000010000001000 | 3 |
| 174 | 00010001000100100 | 3 | 10010000100100100 | 3 | 10001000010001000 | 3 | 01000001000000100 | 3 |
| 175 | 00001001001000100 | 3 | 10000100000010000 | 3 | 10001000001000100 | 3 | 00100100100100100 | 3 |
| 176 | 00001000100100100 | 3 | 10000010000001000 | 3 | 10000100100010000 | 3 | 00100010000010000 | 3 |
| 177 | 00000100000010000 | 3 | 10000001000000100 | 3 | 10000100010001000 | 3 | 00100001000001000 | 3 |
| 178 | 00000010000001000 | 3 | 00100010000010000 | 3 | 10000100000100100 | 3 | 00100000100000100 | 3 |
| 179 | 10010001000010000 | 3 | 00100000100001000 | 3 | 10000000000100000 | 4 | 10000100100000000 | 4 |
| 180 | 10010000100001000 | 3 | 00100000010000100 | 3 | 10000000001000000 | 4 | 10000100010000000 | 4 |

FIG. 12I

| DATA SYMBOL | DCG31 Code Word MSB LSB | NCG | DCG32 Code Word MSB LSB | NCG | DCG41 Code Word MSB LSB | NCG | DCG42 Code Word MSB LSB | NCG |
|---|---|---|---|---|---|---|---|---|
| 181 | 1001000010000100 | 3 | 0001000100010000 | 3 | 0100000000100000 | 4 | 1000001001000000 | 4 |
| 182 | 1000100010001000 | 3 | 0001000010001000 | 3 | 1000000010000000 | 4 | 1000000100100000 | 4 |
| 183 | 1000100001001000 | 3 | 0001000001000100 | 3 | 0100000001000000 | 4 | 1000100010000000 | 4 |
| 184 | 1000100001000100 | 3 | 0000100010010000 | 3 | 0010000000100000 | 4 | 1000010010000000 | 4 |
| 185 | 1000010010010000 | 3 | 0000100001001000 | 3 | 1001001010000000 | 4 | 1000001000100000 | 4 |
| 186 | 1000010001001000 | 3 | 0000100000100100 | 3 | 1001000101000000 | 4 | 1000001001000000 | 4 |
| 187 | 1000010000100100 | 3 | 1001001001001000 | 3 | 1001000010100000 | 4 | 0100010001000000 | 4 |
| 188 | 0010010010000100 | 3 | 1001000100100100 | 3 | 0100100100100000 | 4 | 0100000100100000 | 4 |
| 189 | 0010010001000100 | 3 | 1001000010100100 | 3 | 0100100010100000 | 4 | 0100000010100000 | 4 |
| 190 | 0010001001001000 | 3 | 1000100000010000 | 3 | 0010010010100000 | 4 | 0100000001000000 | 4 |
| 191 | 0010001001000100 | 3 | 1000010001000100 | 3 | 0010010001000000 | 4 | 1001000010000000 | 4 |
| 192 | 0010001001001000 | 3 | 1000010000001000 | 3 | 1001001010000000 | 4 | 1001000001000000 | 4 |
| 193 | 0010001000100100 | 3 | 0010010010010100 | 3 | 1001000100100000 | 4 | 1000010000100000 | 4 |
| 194 | 0001001001000100 | 3 | 0010010000100010 | 3 | 1000100010010000 | 4 | 1000001001000000 | 4 |
| 195 | 0001001001000100 | 3 | 0010001000001000 | 3 | 1000100010100000 | 4 | 0100100010000000 | 4 |
| 196 | 0001000010010100 | 3 | 0010000100010000 | 3 | 0100100010100000 | 4 | 0100100000100000 | 4 |
| 197 | 0000100000010000 | 3 | 0001000100010000 | 3 | 0100001010010000 | 4 | 0100010001000000 | 4 |
| 198 | 0000100000001000 | 3 | 0001000010001000 | 3 | 0100000010010000 | 4 | 0100000100100000 | 4 |
| 199 | 0000010000000100 | 3 | 0001000010000100 | 3 | 0010000010100000 | 4 | 0010010100100000 | 4 |
| 200 | 1000000000100000 | 4 | 1000010010000000 | 4 | 1001010001010000 | 4 | 0010010010000000 | 4 |
| 201 | 1000000001000000 | 4 | 1000010100100000 | 4 | 1001001010000000 | 4 | 0010010001000000 | 4 |
| 202 | 1000000010000000 | 4 | 1000000100100000 | 4 | 1000010010000000 | 4 | 0010000010100000 | 4 |
| 203 | 0010000000100000 | 4 | 1000010010000000 | 4 | 1000000100000000 | 4 | 1001000001000000 | 4 |
| 204 | 0000001001000000 | 4 | 1000001001000000 | 4 | 0100000010000000 | 4 | 1000100010000000 | 4 |
| 205 | 0000100010000000 | 4 | 1000001000100000 | 4 | 0010000010100000 | 4 | 1000010001000000 | 4 |
| 206 | 0000010001000000 | 4 | 1001000010000000 | 4 | 1000000010010001 | 1 | 1001000010010001 | 1 |
| 207 | 0001001000100000 | 4 | 1000100001000000 | 4 | 1000000001001001 | 1 | 1001000001001001 | 1 |
| 208 | 0000100001000000 | 4 | 1000010000100000 | 4 | 1000000100010001 | 1 | 0100100010010001 | 1 |
| 209 | 0000010000100000 | 4 | 0010001001000000 | 4 | 1000000010001001 | 1 | 0100100001001001 | 1 |
| 210 | 1001001010000000 | 4 | 0010000100100000 | 4 | 0100000010010001 | 1 | 0010010010010001 | 1 |
| 211 | 1001001010000000 | 4 | 0010000010100000 | 4 | 0100000001001001 | 1 | 0010010001001001 | 1 |
| 212 | 1001000100100000 | 4 | 1001000010000000 | 4 | 1000000100010001 | 1 | 1001000010010001 | 1 |
| 213 | 0010010010100000 | 4 | 1000100001000000 | 4 | 1000000010001001 | 1 | 1001000010001001 | 1 |
| 214 | 0001000010000000 | 4 | 1000010000100000 | 4 | 0100000100010001 | 1 | 1000100010010001 | 1 |
| 215 | 0000100001000000 | 4 | 0010010010000000 | 4 | 0100000010001001 | 1 | 1000100001001001 | 1 |
| 216 | 0000010000100000 | 4 | 0010001001000000 | 4 | 0010000010010001 | 1 | 0100100100010001 | 1 |
| 217 | 1001001001000000 | 4 | 0010000100100000 | 4 | 0010000010001001 | 1 | 0100100010001001 | 1 |
| 218 | 1001001000100000 | 4 | 0001001001000000 | 4 | 1001001010010001 | 1 | 0100010010010001 | 1 |
| 219 | 1001000100000000 | 4 | 0001000100100000 | 4 | 1001001010001001 | 1 | 0100010001001001 | 1 |
| 220 | 1001000100000000 | 4 | 0001000010010000 | 4 | 1000100100100001 | 1 | 0010010010010001 | 1 |
| 221 | 0010100000100000 | 4 | 1001000010000000 | 4 | 1000001000010001 | 1 | 0010010001001001 | 1 |
| 222 | 0001000001000000 | 4 | 1000100000100000 | 4 | 1000001000001001 | 1 | 0010010010010001 | 1 |
| 223 | 0000100000100000 | 4 | 0010010001000000 | 4 | 0100000100000001 | 1 | 0010010001001001 | 1 |
| 224 | 1001000100000000 | 4 | 0010000100100000 | 4 | 0100000010000001 | 1 | 0100000000010001 | 1 |
| 225 | 1001001010000000 | 4 | 0001001010000000 | 4 | 0010000100010001 | 1 | 0010000000001001 | 1 |
| 226 | 1000010010000000 | 4 | 0001000100100000 | 4 | 0010000010000001 | 1 | 1001001000001001 | 1 |
| 227 | 0010000001000000 | 4 | 0000100100100000 | 4 | 1001001001001001 | 1 | 1001001000001001 | 1 |
| 228 | 0001000000100000 | 4 | 0000100100100000 | 4 | 1001001001001001 | 1 | 1000010000001001 | 1 |
| 229 | 1000000010010001 | 1 | 1001000100010001 | 1 | 1000010000010001 | 1 | 1000001000010001 | 1 |
| 230 | 1000000001001001 | 1 | 1001000001001001 | 1 | 1000010000001001 | 1 | 1000000100100001 | 1 |
| 231 | 1000000100010001 | 1 | 0010010010010001 | 1 | 0100100101001001 | 1 | 0010000000010001 | 1 |
| 232 | 1000000010001001 | 1 | 0010010001001001 | 1 | 0100001000010001 | 1 | 1001001000010001 | 1 |
| 233 | 1000001000100001 | 1 | 0001001000010001 | 1 | 0100000100010001 | 1 | 1001000100010001 | 1 |
| 234 | 1000000100001001 | 1 | 0001001000100001 | 1 | 0010001000010001 | 1 | 1000100100010001 | 1 |
| 235 | 0010000010010001 | 1 | 0000100100010001 | 1 | 0010000100010001 | 1 | 1000100100010001 | 1 |
| 236 | 0010000001001001 | 1 | 0000100010001001 | 1 | 1001000000010001 | 1 | 1000001000010001 | 1 |
| 237 | 1001001010010001 | 1 | 1001000100010001 | 1 | 0100100000010001 | 1 | 1000001000010001 | 1 |
| 238 | 1001001001001001 | 1 | 1001000010010001 | 1 | 0010010001001001 | 1 | 1000000100100001 | 1 |
| 239 | 1001001001001001 | 1 | 1001000010010001 | 1 | 1001000000010001 | 1 | 1000000100100001 | 1 |
| 240 | 1000001000010001 | 1 | 1000100001001001 | 1 | 1000100000001001 | 1 | 0100100100001001 | 1 |

FIG. 12J

| DATA SYMBOL | DCG31 Code Word MSB LSB | NCG | DCG32 Code Word MSB LSB | NCG | DCG41 Code Word MSB LSB | NCG | DCG42 Code Word MSB LSB | NCG |
|---|---|---|---|---|---|---|---|---|
| 241 | 10000001000001001 | 1 | 00100100100010001 | 1 | 01001000000010001 | 1 | 01000100100001001 | 1 |
| 242 | 00100000100010001 | 1 | 00100100010001001 | 1 | 01000100000001001 | 1 | 01000010010001001 | 1 |
| 243 | 00100000010001001 | 1 | 00100010010010001 | 1 | 00100100000010001 | 1 | 01000001001001001 | 1 |
| 244 | 00010000010010001 | 1 | 00100010001001001 | 1 | 00100010000001001 | 1 | 10010001000010001 | 1 |
| 245 | 00010000001001001 | 1 | 00010010010001001 | 1 | 10001000000010001 | 1 | 10010000100001001 | 1 |
| 246 | 10010010010001001 | 1 | 00010001001001001 | 1 | 10000100000001001 | 1 | 10001000100010001 | 1 |
| 247 | 10010001001001001 | 1 | 00000100000010001 | 1 | 01000100000010001 | 1 | 10001000010001001 | 1 |
| 248 | 10000100000010001 | 1 | 00000100000001001 | 1 | 01000010000001001 | 1 | 10000100010010001 | 1 |
| 249 | 10000010000001001 | 1 | 00100000000001001 | 1 | 00100010000010001 | 1 | 10000100001001001 | 1 |
| 250 | 00100001000010001 | 1 | 10010010000001001 | 1 | 00100001000001001 | 1 | 01001001000010001 | 1 |
| 251 | 00100000100001001 | 1 | 10001001000001001 | 1 | 01001001000001000 | 3 | 01001001000010000 | 3 |
| 252 | 00010000100010001 | 1 | 10000100100001001 | 1 | 01000100010000100 | 3 | 01001000100001000 | 3 |
| 253 | 00010000010001001 | 1 | 10000010010001001 | 1 | 01000010010001000 | 3 | 01001000010000100 | 3 |
| 254 | 00001000010010001 | 1 | 10000001001001001 | 1 | 01000010001000100 | 3 | 01000100100010000 | 3 |
| 255 | 00001000010001001 | 1 | 00100000000010001 | 1 | 01000001001001000 | 3 | 01000100010001000 | 3 |

FIG. 13A

| DATA SYMBOL | ACG1 Code Word MSB LSB | NCG | ACG2 Code Word MSB LSB | NCG | ACG3 Code Word MSB LSB | NCG | ACG4 Code Word MSB LSB | NCG |
|---|---|---|---|---|---|---|---|---|
| 000 | 000001000000000 | 4 | 000001000000000 | 4 | 100100010000001 | 1 | 000001000000001 | 1 |
| 001 | 000010000000000 | 4 | 000010000000000 | 4 | 100100100000001 | 1 | 000010000000001 | 1 |
| 002 | 001001000000000 | 4 | 001001000000000 | 4 | 100100100100001 | 1 | 000100000000001 | 1 |
| 003 | 010001000000000 | 4 | 010001000000000 | 4 | 000000001000001 | 1 | 000001000100001 | 1 |
| 004 | 010010000000000 | 4 | 010010000000000 | 4 | 000000010000001 | 1 | 000001001000001 | 1 |
| 005 | 010010010001001 | 1 | 010010010010010 | 2 | 100100010000010 | 2 | 000010000100001 | 1 |
| 006 | 010010010010000 | 3 | | | 100100100000010 | 2 | 000010001000001 | 1 |
| 007 | 010010010010001 | 1 | | | 000000010010010 | 2 | 000010010000001 | 1 |
| 008 | 010010010010010 | 2 | | | 100100010010010 | 2 | 000100000100001 | 1 |
| 009 | | | | | 100100100010010 | 2 | 000100001000001 | 1 |
| 010 | | | | | 100100100100010 | 2 | 000100010000001 | 1 |
| 011 | | | | | 000000001000010 | 2 | 000100100000001 | 1 |
| 012 | | | | | 000000010000010 | 2 | 100100100100001 | 1 |
| 013 | | | | | 100100010000100 | 3 | 000100100100001 | 1 |
| 014 | | | | | 100100100000100 | 3 | 000010000000010 | 2 |
| 015 | | | | | 100100100001000 | 3 | 000100000000010 | 2 |
| 016 | | | | | 100100100100100 | 3 | 000001000010010 | 2 |
| 017 | | | | | 000000001000100 | 3 | 000001000100010 | 2 |
| 018 | | | | | 000000001001000 | 3 | 000001001000010 | 2 |
| 019 | | | | | 000000010000100 | 3 | 000001000010010 | 2 |
| 020 | | | | | 000000010001000 | 3 | 000010000100010 | 2 |
| 021 | | | | | 000000010010000 | 3 | 000010001000010 | 2 |
| 022 | | | | | 100100010001000 | 3 | 000010010000010 | 2 |
| 023 | | | | | 100100010010000 | 3 | 000100000100010 | 2 |
| 024 | | | | | 100100100100000 | 3 | 000100001000010 | 2 |
| 025 | | | | | 000000001000000 | 4 | 000100010000010 | 2 |
| 026 | | | | | 000000010000000 | 4 | 000100100000010 | 2 |
| 027 | | | | | 000001000000000 | 4 | 100100100100010 | 2 |
| 028 | | | | | 000010000000000 | 4 | 000100000010010 | 2 |
| 029 | | | | | 100100100010000 | 4 | 100100100010010 | 2 |
| 030 | | | | | 001001000000000 | 4 | 000001000000010 | 2 |
| 031 | | | | | 100001000000000 | 4 | 000010000010010 | 2 |
| 032 | | | | | 100010000000000 | 4 | 000100000010010 | 2 |
| 033 | | | | | 100100100100000 | 4 | 000100100010010 | 2 |
| 034 | | | | | 100100010001001 | 1 | 000100100100010 | 2 |
| 035 | | | | | 100100100001001 | 1 | 000100000000100 | 3 |
| 036 | | | | | 100100100010001 | 1 | 000001000100100 | 3 |
| 037 | | | | | 000000001001001 | 1 | 000001001000100 | 3 |
| 038 | | | | | 000000010001001 | 1 | 000001001001000 | 3 |
| 039 | | | | | 000000010010001 | 1 | 000010000100100 | 3 |
| 040 | | | | | 100100010010001 | 1 | 000010001000100 | 3 |
| 041 | | | | | | | 000010001001000 | 3 |
| 042 | | | | | | | 000010010000100 | 3 |
| 043 | | | | | | | 000010010001000 | 3 |
| 044 | | | | | | | 000010010010000 | 3 |
| 045 | | | | | | | 000100001000100 | 3 |
| 046 | | | | | | | 000100010000100 | 3 |
| 047 | | | | | | | 000100010001000 | 3 |
| 048 | | | | | | | 000100100000100 | 3 |
| 049 | | | | | | | 000100100001000 | 3 |
| 050 | | | | | | | 000100100010000 | 3 |
| 051 | | | | | | | 000100000100100 | 3 |
| 052 | | | | | | | 000100001001000 | 3 |
| 053 | | | | | | | 000100010010000 | 3 |
| 054 | | | | | | | 100100100100100 | 3 |
| 055 | | | | | | | 000001000000100 | 3 |
| 056 | | | | | | | 000001000001000 | 3 |
| 057 | | | | | | | 000001000010000 | 3 |
| 058 | | | | | | | 000010000000100 | 3 |
| 059 | | | | | | | 000010000001000 | 3 |
| 060 | | | | | | | 000010000010000 | 3 |

FIG. 13B

| DATA SYMBOL | ACG1 Code Word MSB LSB | NCG | ACG2 Code Word MSB LSB | NCG | ACG3 Code Word MSB LSB | NCG | ACG4 Code Word MSB LSB | NCG |
|---|---|---|---|---|---|---|---|---|
| 061 | | | | | | | 000100000001000 | 3 |
| 062 | | | | | | | 000100000010000 | 3 |
| 063 | | | | | | | 000100100100100 | 3 |
| 064 | | | | | | | 000100100100000 | 4 |
| 065 | | | | | | | 000001000000000 | 4 |
| 066 | | | | | | | 000010000000000 | 4 |
| 067 | | | | | | | 000001000100000 | 4 |
| 068 | | | | | | | 000001001000000 | 4 |
| 069 | | | | | | | 000010000100000 | 4 |
| 070 | | | | | | | 000010001000000 | 4 |
| 071 | | | | | | | 000010010000000 | 4 |
| 072 | | | | | | | 000100000100000 | 4 |
| 073 | | | | | | | 000100001000000 | 4 |
| 074 | | | | | | | 000100010000000 | 4 |
| 075 | | | | | | | 000100100000000 | 4 |
| 076 | | | | | | | 001001000000000 | 4 |
| 077 | | | | | | | 010001000000000 | 4 |
| 078 | | | | | | | 010010000000000 | 4 |
| 079 | | | | | | | 100001000000000 | 4 |
| 080 | | | | | | | 100010000000000 | 4 |
| 081 | | | | | | | 100100100100000 | 4 |
| 082 | | | | | | | 000100000001001 | 1 |
| 083 | | | | | | | 000001001001001 | 1 |
| 084 | | | | | | | 000010001001001 | 1 |
| 085 | | | | | | | 000100010001001 | 1 |
| 086 | | | | | | | 000100010010001 | 1 |
| 087 | | | | | | | 000100001001001 | 1 |
| 088 | | | | | | | 000100010001001 | 1 |
| 089 | | | | | | | 000100010010001 | 1 |
| 090 | | | | | | | 000100100001001 | 1 |
| 091 | | | | | | | 000100100010001 | 1 |
| 092 | | | | | | | 000001000001001 | 1 |
| 093 | | | | | | | 000001000010001 | 1 |
| 094 | | | | | | | 000010000001001 | 1 |
| 095 | | | | | | | 000010000010001 | 1 |
| 096 | | | | | | | 000100000010001 | 1 |
| 097 | | | | | | | 100100100010001 | 1 |

… continued…

CODE GENERATION AND ALLOCATION METHOD

CROSS-REFERENCE TO RELATED APPLICATIONS

This application is a continuation of U.S. patent application Ser. No. 10/787,156, filed Feb. 27, 2004, now U.S. Pat. No. 6,859,152, which is a continuation of application Ser. No. 10/125,564, filed Apr. 19, 2002, now U.S. Pat. No. 6,781,527, and also claims the benefit of Korean Patent Application No. 2001-21360, filed Apr. 20, 2001 in the Korean Industrial Property office, the disclosures of which are incorporated herein by reference.

BACKGROUND OF THE INVENTION

1. Field of the Invention

The present invention relates to a method of generating and allocating modulation codes of source codes to be recorded on a recording medium, and more particularly, to a method of generating codewords with a restricted run length and allocating the generated codewords to form a code stream so that a DC control characteristic of the code stream is maintained.

2. Description of the Related Art

In a Run Length Limited (RLL) code represented by (d, k, m, n), the performance of a code is evaluated mainly based on a recording density and a capability to suppress a DC component of the code. Here, "m" denotes the number of data bits (the number of so-called source data bits, which is also referred to as the number of information word bits), "n" denotes the number of codeword bits after modulation (the number of so-called channel bits) of the source data bits, "d" denotes the minimum number of a series of '0s' that can exist between '1' and '1' in a codeword, and "k" denotes the maximum number of a series of '0s' that can exist between '1' and '1' in a codeword. An interval between the codeword bits in a codeword is represented by T.

A modulation method, to improve a recording density, is used to reduce the number of the codeword bits "n" while regarding "d" and "m" as given conditions. In the RLL code, however, "d", which is the minimum number of a series of '0s' that can exist between '1' and '1' in a codeword, and "k", which is the maximum number of a series of '0s' that can exist between '1' and '1' in a codeword, should be satisfied. If, with this (d, k) condition satisfied, the number of data bits is "m", the number of codewords satisfying RLL(d, k) should be equal to or greater '1' and '1' in a codeword, should be satisfied. If, with this (d, k) condition satisfied, the number of data bits is "m", the number of codewords satisfying RLL(d, k) should be equal to or greater than $2^m$. Moreover, in order to actually use this code, run length constraints, that is, RLL(d, k) conditions, should be satisfied in a part where a codeword is linked to another codeword. In addition, when the DC component of a code affects the system performance, it is desirable to use a code which has a DC suppression capability.

The main reason for suppressing the DC component in the RLL modulated code stream is to minimize an effect of a reproducing signal on a servo band. Hereinafter, methods of suppressing the DC component will be referred to as Digital Sum Value (DSV) control methods.

The DSV control methods can be broadly classified into two types. One is a method having a DSV control code itself, where the DSV control code is capable of controlling a DSV. The other one is a method of inserting a merge bit at each DSV control time. An Eight to Fourteen Modulation plus (EFM+) code performs DSV control using a separate code table while the EFM code or a (1, 7) code performs the DSV control by inserting the merge bit.

Therefore, the shape of the prior art modulation code group having the DSV control code itself capable of controlling suppression of the DC component and satisfying the conditions described above is as shown in FIG. 1, in which each of a predetermined number of main conversion code groups has a corresponding code group for controlling suppression of the DC component. Each main conversion code group and the corresponding code group form a pair so that the DC component can be suppressed and controlled. In this case, there are some characteristics in the codewords of predetermined main conversion code groups. That is, there are no identical codewords between the main conversion code groups A and B. If duplicated codes are used, there might be the main conversion code groups C and D for demodulating the duplicated codes, where there are no identical codewords between the main conversion code groups C and D, but codewords in the main conversion code group A or B may be in the main conversion code group C or D for demodulating duplicated codes. The number of codewords in the main conversion code groups A and B and the main conversion code groups C and D for demodulating duplicated codes is $2^m$ if the number of bits in the source word before conversion is "m".

If corresponding code groups E through H are DC suppression control code groups used for suppressing the DC components together with the main conversion code groups A through D, respectively, the characteristics of codewords in each of the corresponding code groups E through H are the same as the characteristics of codewords in the main conversion code groups A through D, respectively. That is, the same conditions for generating duplicated codewords or the same conditions for determining the number of lead zeros in a codeword are applied to each of the DC suppression control code groups E through H for controlling suppression of DC components and the main conversion code groups A through D.

For example, the characteristics of the EFM+ code, which is used in current Digital Versatile Discs (DVD), has a run length condition of RLL(2, 10) and a codeword length (n) of 16 bits, is as shown in FIG. 2. The main conversion code groups are MCG1 ("A" in FIG. 1) and MCG2 ("B" in FIG. 1) and the conversion code groups for demodulating duplicated codes are DCG1 ("C" in FIG. 1) and DCG2 ("D" in FIG. 1). There are four DSV code groups ("E~H" in FIG. 1) which make pairs with respective conversion code groups to control suppression of DC components. There are no identical codewords between the four conversion code groups and the four DSV code groups which are code groups for controlling DC components.

Also, the conditions for generating duplicated codewords in the entire code groups are the same, and the characteristics of codewords in each code group pair that can control DC components (MCG1 and the first DSV code group, MCG2 and the second DSV code group, DCG1 and the third DSV code group, or DCG2 and the fourth DSV code group) are the same.

That is, a codeword having a continuous sequence of from 2 to 5 zeros from the Least Significant Bit (LSB) of the codeword is generated using duplicated codewords. This rule is applied to each code group in the same manner. In each of the codewords of the first DSV code group for controlling suppression of DC components, which controls suppression of DC components together with the main conversion code group MCG1, there is a continuous sequence of between 2 and 9 '0s' from the Most Significant Bit (MSB). In each of the codewords of the second DSV code group for controlling suppression of DC components, which controls suppression of DC components together with the main conversion code group MCG2, there is either 0 or 1 '0' continuing from the MSB.

Some bits (here, b15(MSB) or b3) in the codewords of the third DSV code group control the suppression of the DC components together with the corresponding conversion code group DCG1 for demodulating duplicated codes are '0b', while some bits (here, b15(MSB) or b3) in the codewords of the fourth DSV code group for controlling suppression of DC components control the suppression of the DC components together with the corresponding code group DCG2 for demodulating duplicated codes, and some bits (here, b15(MSB) and b3) are '1b'. In developing 8 to 15 modulation code which has an advantage in the recording density aspect compared to the prior art modulation method EFM+ which uses the modulation code group shown in FIG. 1 or 2, the original characteristics of a code stream change when a change occurs in a codeword because of a boundary rule applied to the locations adjacent to a boundary which connects a codeword to another codeword.

SUMMARY OF THE INVENTION

To solve the above and other problems, it is an objective of the present invention to provide a method of generating and allocating codewords having a run length restriction so that original characteristics of a code stream are maintained without change even when a codeword is replaced according to a boundary rule when the code stream is allocated.

Additional objects and advantageous of the invention will be set forth in part in the description which follows and, in part, will be obvious from the description, or may be learned by practice of the invention.

To achieve the above and other objects according to an embodiment of the present invention, there is provided a method of generating and allocating codewords of source words which are to be recorded on a recording medium, the method including generating codewords satisfying predetermined run length conditions and grouping codewords according to each run length condition; and allocating the codewords such that a code(word) for the source word is capable of controlling suppression of DC components.

It is preferable that when a predetermined boundary condition is not satisfied in the code stream, allocating codewords such that codewords which satisfy the boundary condition and maintain the DC control characteristics which are considered when the initial codewords are allocated replace the initial codewords.

The generating of the codewords includes generating codewords satisfying the length of a predetermined first codeword, and predetermined run length conditions, grouping the codewords according to each predetermined run length condition to generate a main conversion codeword table; generating DC control codewords satisfying the length of a predetermined second codeword, and predetermined run length conditions in order to control DC components in the code(word) stream, grouping the DC control codewords, and generating a code conversion table for controlling DC components; and generating additional DC control codewords by taking codewords which satisfy the predetermined run length conditions and are not needed in the main conversion codeword table, and grouping the additional DC control codewords.

Also, there is provided another allocation method of allocating codewords generated for source words to be recorded on a recording medium, the method including when a preceding codeword "a" and a following codeword "b" form a code stream X, allocating one of two selectable codewords b1 and b2 as codeword "b", in which codewords b1 and b2 have opposite INV values which are parameters indicating whether the number of '1s' contained in a codeword is an odd number or an even number and when the code stream of "a" and b1 is X1, and the code stream of "a" and b2 is X2, allocating codewords such that the INVs of X1 and X2 are maintained to be opposite when "a" or b1(b2) (b1 or b2) should be replaced by other codewords in compliance with a predetermined boundary condition given between codewords.

It is preferable that when the predetermined boundary condition is that the number of continuous '0s' between codewords should be at least 2, and when the number of continuous '0s' from the Least Significant Bit (LSB) of the codeword "a" in the Most Significant Bit (MSB) direction is 0, and the number of continuous '0s' from the MSB of the codewords b1 or b2 in the LSB direction is 1, code changes of either the codeword "a" or b1(b2) (b1 or b2) occur to satisfy the boundary condition.

It is preferable that when the number of continuous '0s' between the codewords "a" and "b" is 1 or 0, the codeword "a" or "b" is changed such that the number of 0s forming the boundary is greater than 2 and less than 10.

It is preferable that the codeword "a" of the code stream X1 and the codeword "a" of the code stream X2 are changed to other codewords such that the resulting codewords "a" of code streams X1 and X2 have the same INV value, and as a result, by the INVs of codewords b1 and b2 following the codewords "a" respectively, the INVs of the X1 and X2 become different.

Also, there is provided an allocation method of allocating codewords of source words to be recorded on a recording medium, the method including when a preceding codeword "b" and a following codeword "c" form a code stream Y, allocating one of two selectable codewords b1 and b2 as the codeword "b", wherein codewords b1 and b2 have opposite INVs which are parameters indicating whether the number of '1s' contained in a codeword is an odd number or an even number and when the code stream of b1 and "c" is Y1, and the code stream of b2 and "c" is Y2, allocating codewords such that INVs of Y1 and Y2 are maintained to be opposite when the codeword b1, b2, or "c" should be replaced by another codeword in compliance with a predetermined boundary condition between codewords.

It is preferable that when the predetermined boundary condition is that the number of continuous '0s' between codewords should be at least 2, and when the number of continuous '0s' from the Least Significant Bit (LSB) of the codeword "c" toward the Most Significant Bit (MSB) is 1, codeword "b" which does not satisfy the boundary condition and is xxxxxxxxxxx1001 or xxxxxxxxxx10001 appears in both b1 and b2.

BRIEF DESCRIPTION OF THE DRAWINGS

These and other objects and advantageous of the invention will become apparent and more readily appreciated from the following description of the preferred embodiments, taken in conjunction with the accompanying drawings of which:

FIG. 2 is a table showing characteristics of codewords included in the modulation code group of FIG. 1;

FIG. 4 is a main code conversion table showing a variety of codeword groups and characteristics of codewords in each codeword group;

FIG. 5 is a corresponding code conversion table showing a variety of the codeword groups for DC control and characteristics of the codewords in each codeword group;

FIGS. 11A through 11E are the main code conversion code tables of FIG. 4;

FIGS. 12A through 12J are the corresponding code conversion tables for DC control of FIG. 5;

FIGS. 13A and 13B are the auxiliary code conversion tables for DC control of FIG. 7.

DETAILED DESCRIPTION OF THE PREFERRED EMBODIMENTS

Figure 1:
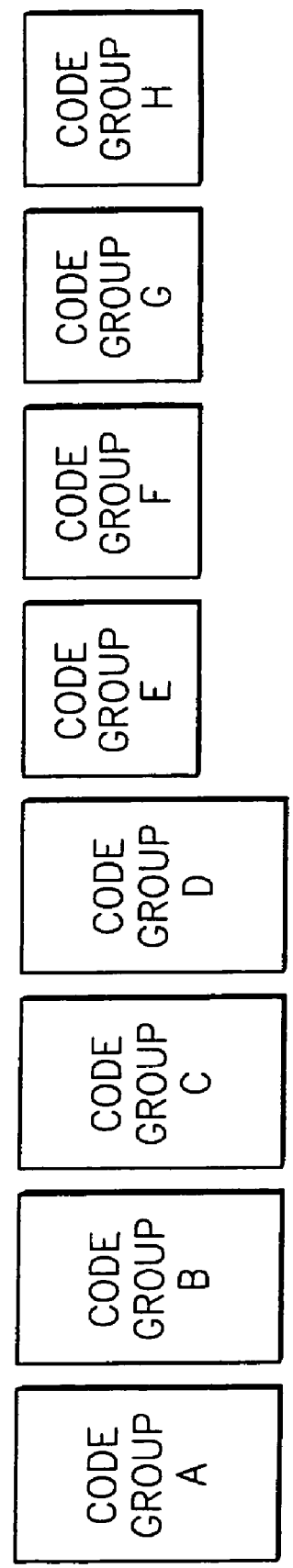
FIG. 1 is a diagram of an example of a conventional modulation code group.

Reference will now be made in detail to the present preferred embodiments of the present invention, examples of which are illustrated in the accompanying drawings, wherein like reference numerals refer to the like elements throughout. The embodiments are described in order to explain the present invention by referring to the figures.

Figure 3:
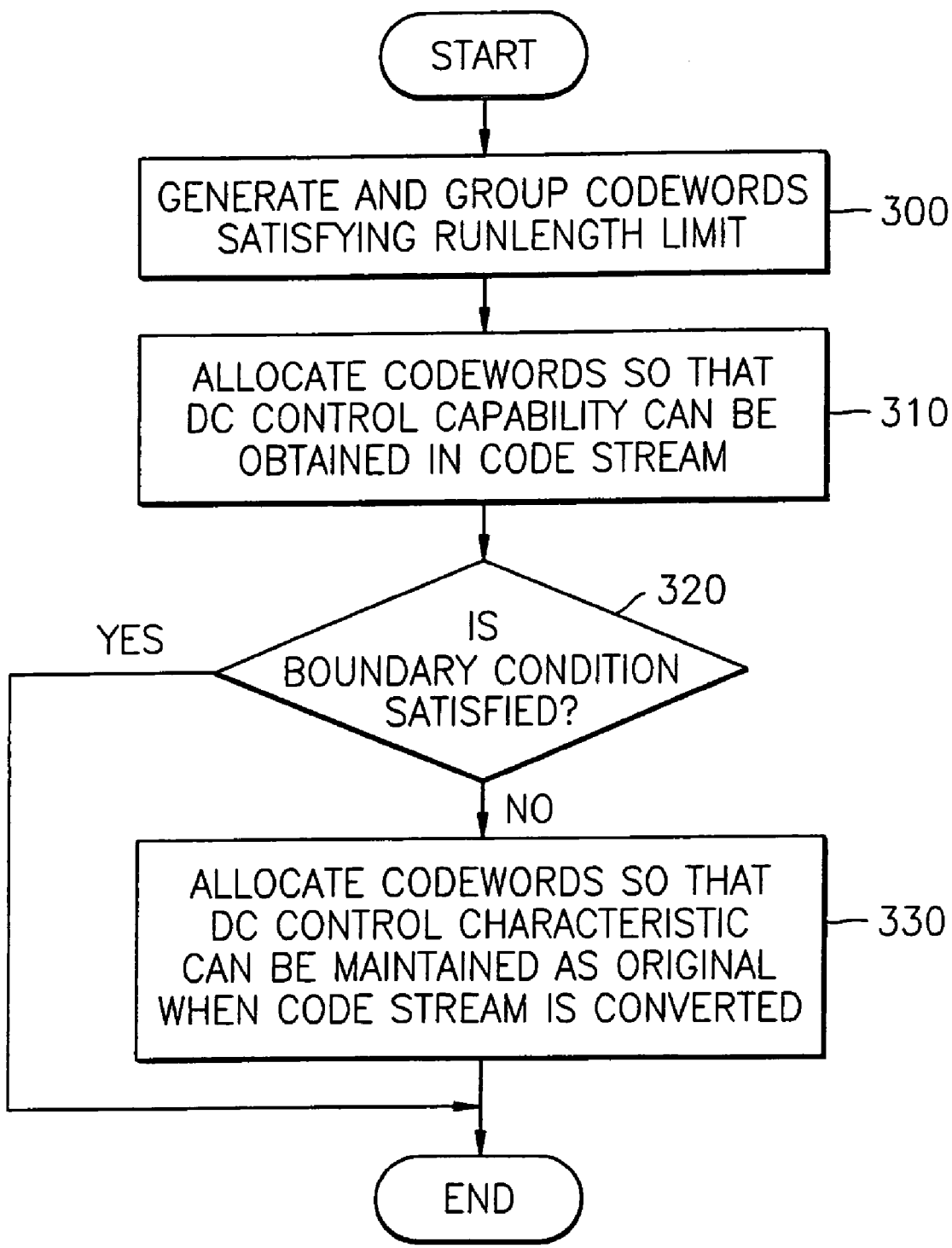
FIG. 3 is a flowchart showing a method of generating and allocating codes according to an embodiment of the present invention.

FIG. 3 is a flowchart showing a method of generating and allocating codes according to the present invention. According to the method of generating and allocating codewords of source words to be recorded on a recording medium, the codewords satisfying predetermined run length conditions are generated and the generated codewords are grouped according to each run length condition in operation 300. The codewords are allocated so that the code (word) streams for source words are capable of controlling DC components in operation 310. It is determined whether or not predetermined boundary conditions are satisfied in the code stream in operation 320. If the conditions are not satisfied, the codewords are replaced by codewords satisfying the boundary conditions while the DC control characteristics are maintained even when the original codewords are allocated in operation 330.

Code tables of the codewords for source code conversion are roughly divided into three types: 1) a main conversion table, 2) a corresponding conversion table for controlling DC components, and 3) an auxiliary conversion table for controlling the DC components.

FIG. 4 is a table showing a variety of codeword groups of a main conversion table and the characteristics of codewords in each code group. It is assumed that "d" denotes the minimum run length limit of a series of continuous "0"s of a codeword, "k" denotes the maximum run length limit of a series of continuous "0"s of a codeword, "m" denotes the number of bits of source data, "n" denotes the number of bits of a codeword after modulation of the source data, End Zero (EZ) denotes the number of '0s' in a continuous sequence from the LSB of a codeword in a direction toward the MSB of the codeword, and Lead Zero (LZ) denotes the number of '0s' in a continuous sequence from the MSB of a codeword in a direction toward the LSB of the codeword. For example, codewords that satisfy d=0, k=10, m=8, n=15, 0≦EZ≦8 are divided according to the following LZ conditions:

1) number of codewords satisfying 2≦LZ≦10: 177
2) number of codewords satisfying 1≦LZ≦9: 257
3) number of codewords satisfying 0≦LZ≦6: 360
4) number of codewords satisfying 0≦LZ≦2: 262

If the number of bits of the source data satisfies m=8, the number of codewords for conversion should be 256 or more. However, in condition 1), the number of codewords does not amount to 256. Therefore, the number of codewords in condition 1) can amount to 256 by taking some codewords from a condition having a surplus number of codewords. In this case, 83 codewords from the codewords satisfying group 3)'s LZ condition may be taken and added to group 1). Then, the numbers of codewords included in conditions 1) through 4) are 260, 257, 277(=360−83), and 262, respectively, and satisfy the minimum number of modulation codewords, that is, 256 for 8-bit source data. In the table of FIG. 4, Main Code Group 1 (MCG1) is the name of a code group containing codewords satisfying condition 1) and some (83) codewords are taken from main code group 3 (MCG3) satisfying condition 3). MCG2 and MCG4 are the names of codewords satisfying condition 2), and 4), respectively. MCG3 is the name of codewords satisfying condition 3), excluding the 83 codewords taken by MCG1. In each of the main code groups MCG1 through MCG4, only 256 codewords can be used as conversion codes for source codes.

FIG. 5 is a corresponding conversion table showing a variety of codeword groups for the DC control and the characteristics of codewords in each codeword group. For example, assuming that d=2, k=10, m=8, n=17, and 0≦EZ≦8, conversion code tables for controlling DC components may include the following 4 groups (corresponding to DCG1, DCG2, DCG3, and DCG4 of FIG. 5, respectively) according to the LZ conditions:

1) number of codewords satisfying 2≦LZ≦10: 375
2) number of codewords satisfying 1≦LZ≦9: 546
1) number of codewords satisfying 0≦LZ≦6: 763
1) number of codewords satisfying 0≦LZ≦2: 556

Each group forming the corresponding conversion table for controlling the DC components should have at least 2 codewords that selectively correspond to one source data, and therefore should have at least 512 (=$2^8+2^8$) codewords for 8-bit source data. Since the number of codewords in the code group satisfying the LZ condition 1) is less than 512, code group 1) can take surplus codewords from other code groups satisfying other LZ conditions to amount to the number of 512. For example, in the above embodiment, code group 1 DCG1 may take 177 codewords from the code group 3 DCG3 satisfying the condition 3) so as to have 552 (=375+177) codewords.

Figures 6, 7:
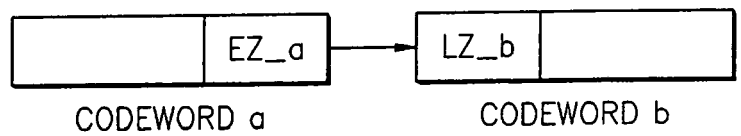
FIG. 6 is an auxiliary conversion table showing a variety of the codeword groups for DC control and characteristics of the codewords in each codeword group.
FIG. 7 is a diagram for showing what should be considered for the run length conditions between adjacent codewords "a" and "b"

FIG. 6 is an auxiliary conversion table showing a variety of codeword groups for the DC control and the characteristics of codewords in each code group. For example, among codewords satisfying d=2, k=10, m=8, and n=15, codewords satisfying 9≦EZ≦10, the remaining codewords of the main code conversion groups (MCGs), and codewords satisfying LZ=7, 8 or LZ=4, 5 are used as codewords of auxiliary code groups (ACGs) for controlling the suppression of the DC components. The conditions for generating these codewords will now be explained in detail. The following conditions correspond to ACG1 through ACG4, respectively, which are names of the auxiliary conversion table for controlling the suppression of the DC components:

1) 5 codewords (satisfying $9 \leq EZ \leq 10$ and $LZ \neq 0$)+the remaining 4 codewords (in the MCG1)=9 codewords, 2) 5 codewords (satisfying $9 \leq EZ \leq 10$ and $LZ \neq 0$)+1 remaining codewords (in the MCG1)=6 codewords, 3) 5 codewords (satisfying $9 \leq EZ \leq 10$ and $LZ \neq 1$)+15 codewords (satisfying $7 \leq LZ \leq 8$ and $0 \leq EZ \leq 8$)+21 remaining codewords (in MCG3)=41 codewords, 4) 7 codewords (satisfying $9 \leq EZ \leq 10$+the remaining 6 codewords in the MCG4)+85 codewords (satisfying $3 \leq LZ \leq 5$ and $0 \leq EZ \leq 8$)=98 codewords.

When a codeword "a" and a codeword "b" are connected, the junction where the two codewords are connected should satisfy a run length (d, k) condition. FIG. 7 is a diagram showing what should be considered for the run length conditions when the codewords "a" and "b" are connected. Satisfying the run length condition means that in FIG. 7 a value obtained by adding the end zero (EZ_a) of the codeword "a" and the lead zero (LZ_b) of the codeword "b" is equal to or greater than the minimum run length "d" and equal to or less than the maximum run length "k".

Figures 8, 9:
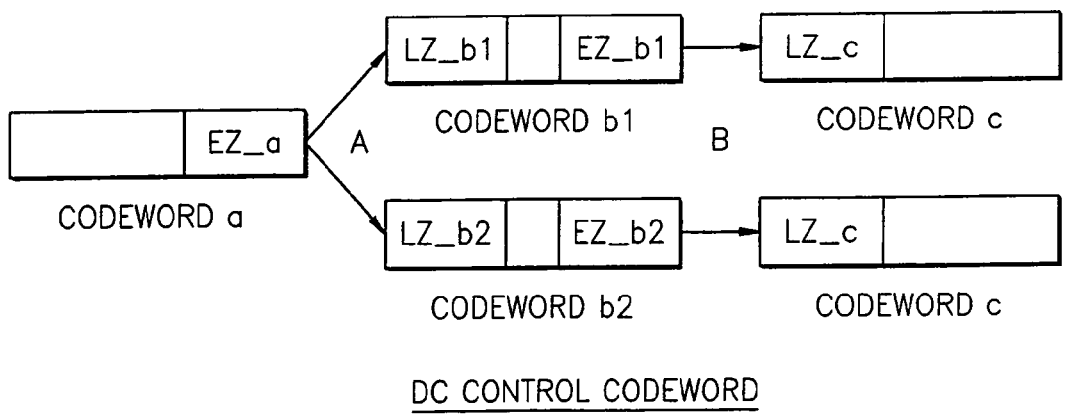
FIG. 8 is a table showing an example of changes in INV values of code streams before code conversion and after code conversion when the run length conditions described in FIG. 7 are not satisfied.
FIG. 9 is a diagram showing an example of code stream branches having selective codewords b1 and b2 for DC control.

FIG. 8 is a table showing an example of changes in INV values of code streams (whose meaning will be described below) before code conversion and after code conversion when the run length conditions described in FIG. 7 are not satisfied. The codeword "b" is determined in a group indicated by the EZ of the preceding codeword "a". When the codeword "a" or "b" is included in a code group, in which the number of the codewords is not enough to meet the condition, and is taken out from other code groups, the (d, k) condition may not be satisfied. In this example, the EZ of codeword "a" changes to satisfy the run length condition, which is referred to as the boundary rule. A variable INV value, which indicates whether the number of '1s' in a codeword stream is an even number or an odd number, may change from a previous INV value while the codeword "a" is not changed, according to the boundary rule (condition). Due to this characteristic of the INV value or the boundary rule, attention should be paid when a codeword is allocated according to code conversion tables to control the suppression of the DC components.

FIG. 9 is a diagram showing an example of code stream branches having selectable codewords b1 and b2 for the DC control. One of the major features of the code conversion of the present invention is that the codewords of two code conversion tables that can be selected for the DC control are allocated so that they have opposite INV characteristics (values). When the previous INV value changes according to the boundary rule as described above, if the INV values of both the codewords in the two selectable code conversion tables change, then there will be no problem. Otherwise, characteristics of codewords having opposite INV values cannot be obtained. For this reason, a code conversion table is designed to consider the following.

First, in FIG. 9, at a junction A where the codeword "a" and the codeword "b" are connected to each other, if b1 and b2, which can be selected as the codeword "b", are codewords taken out from DCG 11 and DCG12, respectively, the codewords are regrouped in the codewords DCG1 according to the code conversion table shown in FIG. 5 after being separated from the codewords DCG3 to correspond to the same source code but have different INV values. If the codewords b1 and b2 are codewords of MCG1 and MCG2, respectively, then codewords in which LZ_b1 (the number of LZs of codeword b1) and LZ_b2 (the number of LZs of codeword b2) are 1 are allocated on the location. By doing so, when the EZ of the codeword "a" is '0', according to the boundary rule, the INV value of the codeword "a" is changed in both the code stream containing the codeword b1 and the code stream containing the codeword b2, or the INV value of the codeword "a" does not change in either the code stream containing the codeword b1 or the code stream containing the codeword b2, such that the INV values of the two code streams are maintained to be opposite. An example is as follows:

| source data | 250 | 224 | 27 |
|---|---|---|---|
| code stream1 (before conversion) | 000001000010001 (MCG3) | 000001000001001 (MCG1) | 010010010000000 (MCG1) |
| code stream1 (after conversion) | 000001000010001 | 000001000001000 | 010010010000000 |
| INV1 | 1 | 1 | 0 |
| code stream2 (before conversion) | 000001000010001 (MCG3) | 000001000001001 (MCG1) | 010010000000000 (ACG1) |
| code stream2 (after conversion) | 000001000010001 | 000001000001000 | 010010000000000 |
| INV2 | 1 | 1 | 1 |

Next, in another junction B of FIG. 9, that is, at the junction B where the codeword "b" and codeword "c" are connected to each other, if the codewords b1 and b2 are respectively included in code conversion tables DCG11 and DCG12, DCG21 and DCG22, DCG31 and DCG32, DCG41 and DCG42, MCG1 and ACG1, MCG2 and ACG2, MCG3 and ACG3, or MCG4 and ACG4, and (xx) xxxxxxxxxxx1001 or (xx)xxxxxxxxxx10001 as shown in FIG. 8, the INV value may change according to the boundary rule due to the LZ of the following codeword "c". Therefore, these codewords b1 and b2 are allocated to the location for corresponding same source data in each table such that the INV values of the two code streams are maintained to be opposite. An example is as follows:

| source data | 250 | 152 | 210 |
|---|---|---|---|
| code stream1 (before conversion) | 000001000010001 (MCG3) | 01000000010001001 (DCG11) | 000000100000001 (MCG1) |

-continued

| source data | 250 | 152 | 210 |
|---|---|---|---|
| code stream1 (after conversion) | 000001000010000 | 01000000010001001 | 000000100000001 |
| INV1 | 0 | 0 | 0 |
| code stream2 (before conversion) | 000001000010001 (MCG3) | 01001000010001001 (DCG12) | 010000001001001 (MCG1) |
| code stream2 (after conversion) | 000001000010000 | 01001000010001001 | 010000001001001 |
| INV2 | 0 | 1 | 1 |

For the junctions A and B of FIG. 9, the codewords are first allocated to the location corresponding same source data in each code conversion table (DCG11 and DCG12 or MCG1 and ACG1) considering the above. Referring to the following example, in the junction B, according to the boundary rule, the INV values of code stream 1 and code stream 2 are maintained to be opposite and the INV values of code stream 3 and code stream 4 are maintained to be opposite. Also, at the junction B, according to the boundary rule, the INV values of code stream 1 and code stream 3 are maintained to be opposite and the INV values of code stream 2 and code stream 4 are maintained to be opposite.

FIGS. 12A through 12J are the corresponding conversion tables for DC control in which codewords are generated and allocated after the conditions described above are considered.

FIGS. 13A and 13B are the auxiliary code conversion tables for the DC control in which codewords are generated and allocated after the conditions described above are considered.

Figure 14:
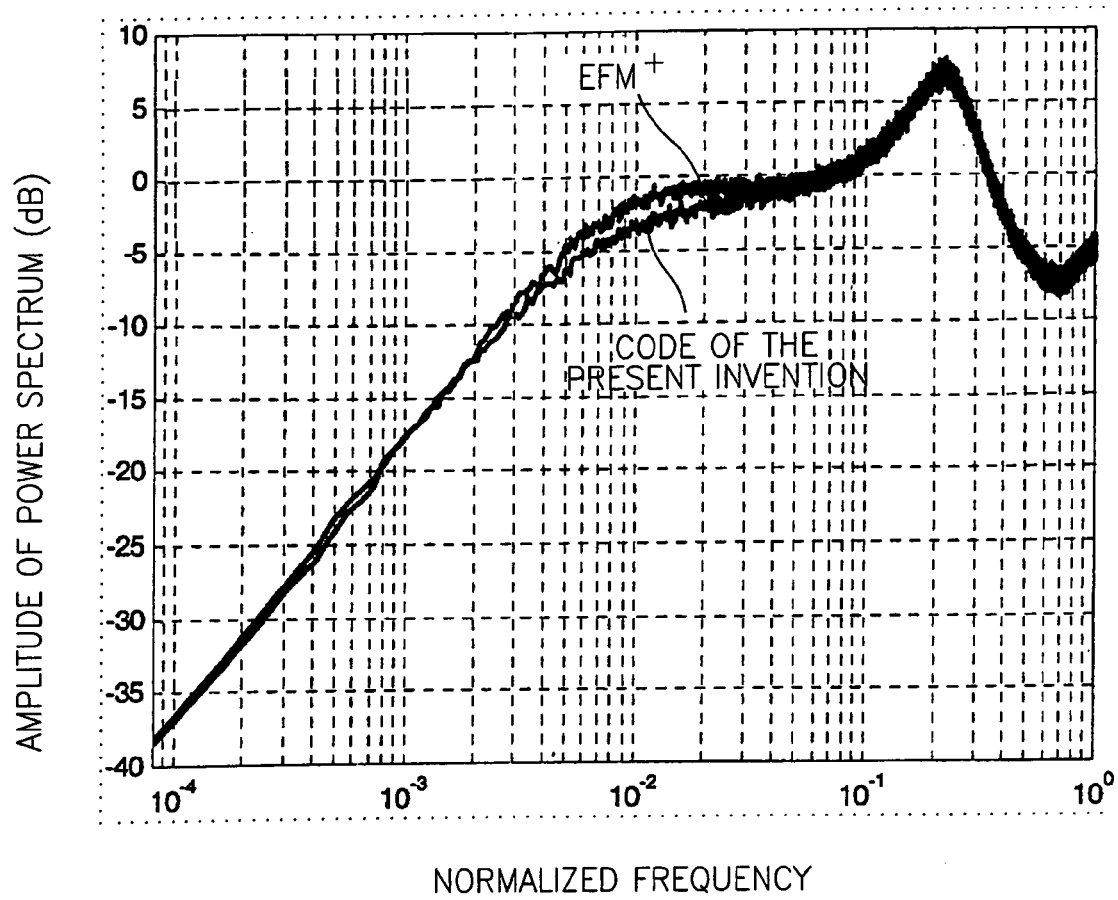
FIG. 14 is a graph showing a difference between a frequency spectrum when codewords of the corresponding code conversion table for DC control according to the embodiment of the present invention are used in 25% of all of the codewords, and the frequency spectrum when prior art EFM+ modulation codewords are used.

FIG. 14 is a graph showing the difference between a frequency spectrum when codewords of the code conversion table for the DC control according to the embodiment of the present invention are used in 25% of all of the codewords,

| source data | 250 | 152 | 7 |
|---|---|---|---|
| code stream1 (before conversion) | 000001000010001 (MCG3) | 01000000010001001 (DCG11) | 010000010010001 (MCG1) |
| code stream1 (after conversion) | 000001000010000 | 01000000010001000 | 010000010010001 |
| INV1 | 0 | 1 | 1 |
| code stream2 (before conversion) | 000001000010001 (MCG3) | 01000000010001001 (DCG11) | 010010010010001 (ACG1) |
| code stream2 (after conversion) | 000001000010000 | 01000000010001000 | 010010010010001 |
| INV2 | 0 | 1 | 0 |
| code stream3 (before conversion) | 000001000010001 (MCG3) | 01001000010001001 (DCG12) | 010000010010001 (MCG1) |
| code stream3 (after conversion) | 000001000010000 | 01001000010001000 | 010000010010001 |
| INV3 | 0 | 0 | 0 |
| code stream4 (before conversion) | 000001000010001 (MCG3) | 01001000010001001 (DCG12) | 010010010010001 (ACG1) |
| code stream4 (after conversion) | 000001000010000 | 01001000010001000 | 010010010010001 |
| INV4 | 0 | 0 | 1 |

Figure 10:
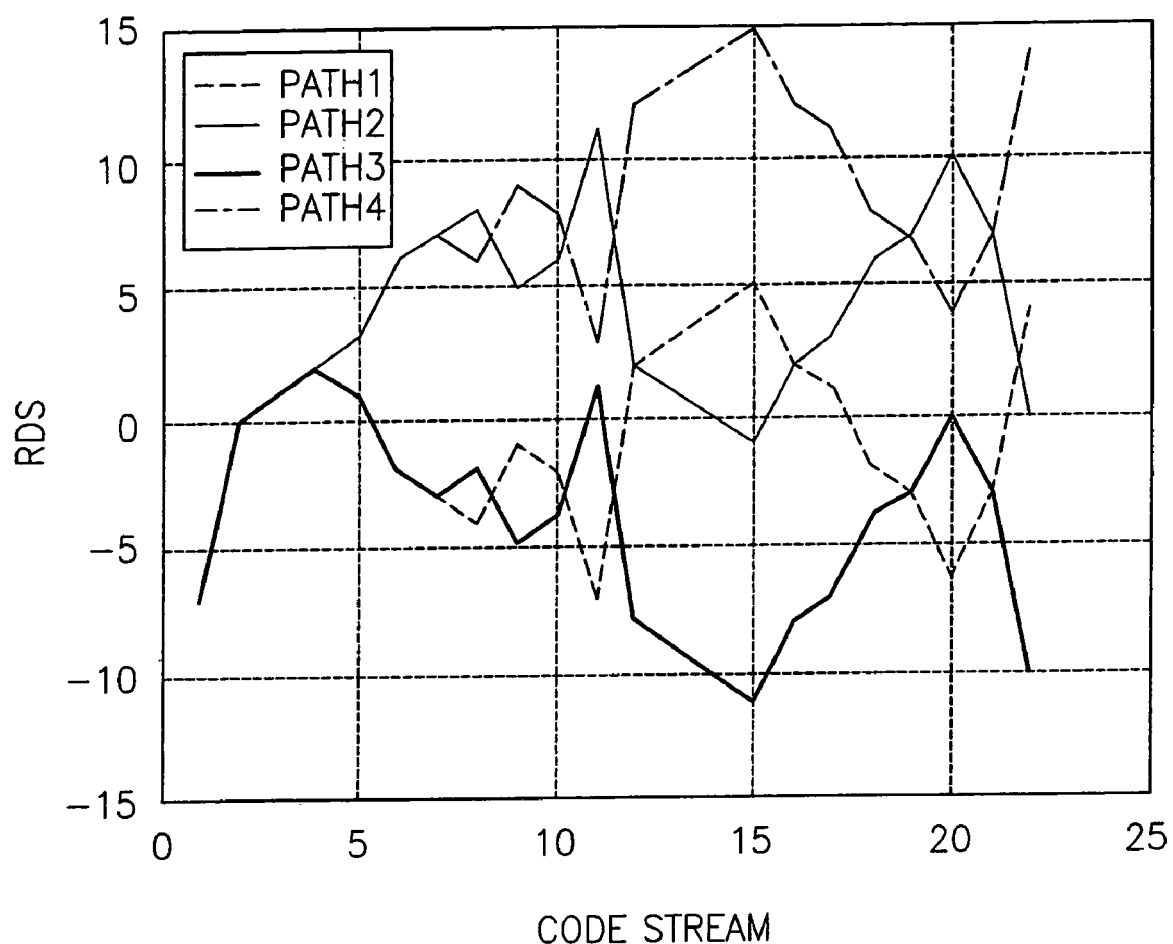
FIG. 10 is a graph showing a relationship between INV values of a code stream pair.

As described above, considering changes in the INV value of a codeword due to the boundary rule in a codeword stream, codewords are allocated so that the INV values (polarities) of a codeword pair after modulation of the source data is always maintained to be opposite. FIG. 10 is a graph showing the relationship of the INV values of this code stream pair. If codewords are allocated such that the INV values of a code stream pair are always opposite, a codeword can be selected so that a code stream having the DC components between the code stream pair is formed.

Exceptions to the rule that INV values are maintained to be opposite at the junction A of FIG. 9 may occur when the amount of the source data is from 251 to 255 in the code conversion table for controlling the DC components. In such exceptional cases, the CSV signs of the codewords are made to be opposite so that the difference between DSV values in the code stream pair is made.

FIGS. 11A through 11E are the main conversion tables in which codewords are generated and allocated after the conditions described above are condsidered.

and another frequency spectrum when prior art EFM+ modulation codewords are used. The graph shows that in a low frequency band, the frequency spectrum of the code words (modulated code stream) according to the present invention is almost the same as the frequency spectrum of the EFM+, which indicates that the code stream of the present invention has almost the same capability of suppressing the DC components as that of the EFM+ method.

Accordingly, since the present invention uses 15-bit codes as the main conversion code and selectively uses 17-bit DC control codes for controlling DC components, the present invention has better efficiency in recording density than the prior art EFM+ code and has the same DC suppression capability as the EFM+ code.

According to the present invention, by using a short codeword having less bits as a main conversion codeword, high efficiency is achieved in recording density.

Also, when codewords which do not satisfy the run length conditions are replaced by other codewords, the codewords are allocated so that the DC suppression capability of the code stream can be maintained, and therefore a higher DC suppression capability of the code stream is provided.

Although a few preferred embodiments of the present invention have been shown and described, it would be appreciated by those skilled in the art that changes may be made in this embodiment without departing from the principles and sprit of the invention, the scope of which is defined in the claims and their equivalents.

What is claimed is:

1. A method of generating and allocating codewords of source words which are to be recorded on a recording medium, the method comprising:

generating codewords satisfying predetermined run length conditions and grouping codewords according to each run length condition; and allocating the codewords in a code stream such that a codeword for the source word controls suppression of DC components of the code stream, wherein in order to make the code stream controlling the suppression of the DC components, allocating the codewords such that a pair of the code stream and an additional code stream having opposite INV characteristics are formed, where the INV characteristics indicate whether the number of '1s' is an odd number or an even number.

2. A method of generating and allocating codewords of source words which are to be recorded on a recording medium, the method comprising:

generating codewords satisfying predetermined run length conditions and grouping codewords according to each run length condition; and allocating the codewords in a code stream such that a codeword for the source word controls suppression of DC components of the code stream; and when a predetermined boundary condition is not satisfied in the code stream, allocating the codewords such that the codewords which satisfy the boundary condition and maintain the DC control characteristics replace initial codewords, wherein the generating of the codewords comprises:

generating the codewords satisfying the length of a predetermined first codeword and predetermined run length conditions, and grouping the codewords according to each predetermined run length condition to generate a main conversion codeword table;

generating DC control codewords satisfying the length of a predetermined second codeword, and predetermined run length conditions in order to control the DC components in the code stream, and grouping the DC control codewords, and generating a code conversion table for controlling the DC components; and generating additional DC control codewords by taking the codewords which satisfy the predetermined run length conditions and are not needed in the main conversion codeword table, and grouping the additional DC control codewords.

3. The method of claim 2, wherein when the bit length of the source word is 8, the length of a codeword in the main conversion code table is 15 bits.

4. The method of claim 3, wherein the main conversion code table contains groups of codewords, the codewords each having from 2 to 10 Lead Zeros (LZs), from 1 to 9 LZs, from 1 to 6 LZs, and from 0 to 2 LZs, while having from 0 to 8 End Zeros (EZs).

5. The method of claim 4, wherein among the groups of the main conversion code table, a group having a lesser number of codewords than the minimum number of codewords for converting the source data takes surplus codewords from a group having a greater number of codewords than the minimum number of codewords so as to amount to the minimum number of codewords.

6. The method of claim 3, wherein the length of the codewords of the DC control conversion code table is 17 bits.

7. The method of claim 6, wherein the DC control conversion code table contains groups of codewords, the groups formed of a group of codewords of which LZ is from 2 and to 10, a group of codewords of which LZ is from 1 to 9, a group of codewords of which LZ is from 0 to 6, and a group of codewords of which LZ is from 0 to 2, while EZ is from 0 to 8.

8. The method of claim 7, wherein each code group of the DC control conversion table has as many codewords as a source word can correspond to pairs of codewords, each pair of codewords has opposite INV characteristics and is selectable.

9. The method of claim 8, wherein among the groups of the DC control conversion code table, a group having a lesser number of codewords than the minimum number of needed codewords takes surplus codewords from a group having a greater number of codewords than the minimum number of codewords, so as to have equal to or greater than the minimum number of codewords.

10. The method of claim 6, wherein the auxiliary DC control conversion table comprises:

a group of codewords, each having a length of 15 bits, having from 9 to 10 EZs, and having at least one LZ, and codewords which are taken from surplus codewords of the first main conversion code group;

a group of codewords, each having a length of 15 bits, having from 9 to 10 EZs, and having at least one LZ, and codewords which are taken from surplus codewords of the second main conversion code group;

a group of codewords, each having a length of 15 bits, having from 9 to 10 EZs, and having no LZ, the surplus codewords of the third main conversion code group, and having 7 to 8 LZs, or having 0 to 8 EZs; and a group of codewords, each having a length of 15 bits, and having 9 or 10 EZs, the surplus codewords of the fourth main conversion code group, and having 3 to 8 LZs and 0 to 8 EZs.

11. The method of claim 10, wherein when the code stream pairs are a, b1, c and a, b2, c, respectively, and b1 and b2 are DC control codewords having opposite INV characteristics, codewords are allocated such that the INV characteristics of code streams after conversion are maintained to be opposite even if code changes of a, b1, b2, or c occur due to violation of the predetermined run length between a, and b1(b2) or b1(b2) and c.

* * * * *